(12) United States Patent
Gao et al.

(10) Patent No.: US 9,443,974 B2
(45) Date of Patent: Sep. 13, 2016

(54) SUPER JUNCTION TRENCH POWER MOSFET DEVICE FABRICATION

(75) Inventors: Yang Gao, San Jose, CA (US); Kyle Terrill, Santa Clara, CA (US); Deva Pattanayak, Saratoga, CA (US); Kuo-In Chen, Los Altos, CA (US); The-Tu Chau, San Jose, CA (US); Sharon Shi, San Jose, CA (US); Qufei Chen, San Jose, CA (US)

(73) Assignee: Vishay-Siliconix, Santa Clara, CA (US)

( * ) Notice: Subject to any disclaimer, the term of this patent is extended or adjusted under 35 U.S.C. 154(b) by 402 days.

(21) Appl. No.: 12/549,190

(22) Filed: Aug. 27, 2009

(65) Prior Publication Data
US 2011/0053326 A1 Mar. 3, 2011

(51) Int. Cl.
| | |
|---|---|
| H01L 21/336 | (2006.01) |
| H01L 29/78 | (2006.01) |
| H01L 29/06 | (2006.01) |
| H01L 29/66 | (2006.01) |
| H01L 29/40 | (2006.01) |
| H01L 29/417 | (2006.01) |
| H01L 29/423 | (2006.01) |

(52) U.S. Cl.
CPC ....... *H01L 29/7813* (2013.01); *H01L 29/0634* (2013.01); *H01L 29/0653* (2013.01); *H01L 29/66727* (2013.01); *H01L 29/66734* (2013.01); *H01L 29/7811* (2013.01); *H01L 29/0661* (2013.01); *H01L 29/407* (2013.01); *H01L 29/41766* (2013.01); *H01L 29/42368* (2013.01)

(58) Field of Classification Search
CPC ........... H01L 29/0634; H01L 29/7802; H01L 29/7813; H01L 29/1095; H01L 29/0653; H01L 29/407; H01L 29/66734; H01L 29/66727; H01L 29/42368; H01L 29/7827; H01L 29/0661; H01L 29/41766; H01L 29/7811
USPC .................................. 438/270; 257/E21.419
See application file for complete search history.

(56) References Cited

U.S. PATENT DOCUMENTS

| | | | |
|---|---|---|---|
| 3,906,540 | A | 9/1975 | Hollins |
| 4,641,174 | A | 2/1987 | Baliga |

(Continued)

FOREIGN PATENT DOCUMENTS

| | | |
|---|---|---|
| CN | 101180737 | 5/2008 |
| DE | 4 208 695 A1 | 9/1992 |

(Continued)

OTHER PUBLICATIONS

Hattori, et al.; Design of a 200V Super Junction MOSFET With N-Buffer Regions and its Fabrication by Trench Filling; Proceedings of 2004 International Symposium on Power Semiconductor Devices & ICS, Kitakyushu; 2004.

(Continued)

*Primary Examiner* — Duy T Nguyen

(57) ABSTRACT

Methods of fabricating a super junction trench power MOSFET (metal oxide semiconductor field effect transistor) device are described. A column of p-type dopant in the super junction is separated from a first column of n-type dopant by a first column of oxide and from a second column of n-type dopant by a second column of oxide. In an n-channel device, a gate element for the FET is advantageously situated over the column of p-type dopant; and in a p-channel device, a gate element for the FET is advantageously situated over the column of n-type dopant.

9 Claims, 28 Drawing Sheets

(56) References Cited

U.S. PATENT DOCUMENTS

| | | |
|---|---|---|
| 4,672,407 A | 6/1987 | Nakagawa et al. |
| 4,782,372 A | 11/1988 | Nakagawa et al. |
| 4,799,095 A | 1/1989 | Baliga |
| 4,823,172 A | 4/1989 | Mihara |
| 4,827,321 A | 5/1989 | Baliga |
| 4,857,986 A | 8/1989 | Kinugawa |
| 4,893,160 A | 1/1990 | Blanchard |
| 4,928,155 A | 5/1990 | Nakagawa et al. |
| 4,939,557 A | 7/1990 | Pao et al. |
| 4,967,243 A | 10/1990 | Baliga et al. |
| 4,969,027 A | 11/1990 | Baliga et al. |
| 5,021,840 A | 6/1991 | Morris |
| 5,055,896 A | 10/1991 | Williams et al. |
| 5,072,266 A | 12/1991 | Bulucea et al. |
| 5,111,253 A | 5/1992 | Korman et al. |
| 5,168,331 A | 12/1992 | Yilmaz |
| 5,191,395 A | 3/1993 | Nishimura |
| 5,221,850 A | 6/1993 | Sakurai |
| 5,233,215 A | 8/1993 | Baliga |
| 5,245,106 A | 9/1993 | Cameron et al. |
| 5,366,914 A | 11/1994 | Takahashi et al. |
| 5,378,655 A | 1/1995 | Hutchings et al. |
| 5,387,528 A | 2/1995 | Hutchings et al. |
| 5,430,315 A | 7/1995 | Rumennik |
| 5,525,821 A | 6/1996 | Harada et al. |
| 5,527,720 A | 6/1996 | Goodyear et al. |
| 5,567,634 A | 10/1996 | Hebert et al. |
| 5,578,508 A | 11/1996 | Baba et al. |
| 5,602,424 A | 2/1997 | Tsubouchi et al. |
| 5,621,234 A | 4/1997 | Kato |
| 5,648,283 A | 7/1997 | Tsang et al. |
| 5,689,128 A | 11/1997 | Hshieh et al. |
| 5,696,396 A | 12/1997 | Tokura et al. |
| 5,770,878 A | 6/1998 | Beasom |
| 5,808,340 A | 9/1998 | Wollesen et al. |
| 5,814,858 A | 9/1998 | Williams |
| 5,877,538 A | 3/1999 | Williams |
| 5,965,904 A | 10/1999 | Ohtani et al. |
| 5,998,836 A | 12/1999 | Williams |
| 5,998,837 A | 12/1999 | Williams |
| 6,049,108 A | 4/2000 | Williams et al. |
| 6,096,584 A | 8/2000 | Ellis-Monaghan et al. |
| 6,140,678 A | 10/2000 | Grabowski et al. |
| 6,153,896 A | 11/2000 | Omura et al. |
| 6,168,996 B1 | 1/2001 | Numazawa et al. |
| 6,172,398 B1 | 1/2001 | Hshieh |
| 6,180,966 B1 | 1/2001 | Kohno et al. |
| 6,204,533 B1 | 3/2001 | Williams et al. |
| 6,211,018 B1 | 4/2001 | Nam et al. |
| 6,238,981 B1 | 5/2001 | Grebs |
| 6,245,615 B1 | 6/2001 | Noble et al. |
| 6,268,242 B1 | 7/2001 | Williams et al. |
| 6,277,695 B1 | 8/2001 | Williams et al. |
| 6,285,060 B1 | 9/2001 | Korec et al. |
| 6,323,518 B1 | 11/2001 | Sakamoto et al. |
| 6,348,712 B1 | 2/2002 | Korec et al. |
| 6,351,009 B1 | 2/2002 | Kocon et al. |
| 6,359,308 B1 | 3/2002 | Hijzen et al. |
| 6,391,721 B2 | 5/2002 | Nakagawa |
| 6,413,822 B2 | 7/2002 | Williams et al. |
| 6,483,171 B1 | 11/2002 | Forbes et al. |
| 6,489,204 B1 | 12/2002 | Tsui |
| 6,495,883 B2 | 12/2002 | Shibata et al. |
| 6,498,071 B2 | 12/2002 | Hijzen et al. |
| 6,580,123 B2 | 6/2003 | Thapar |
| 6,580,154 B2 | 6/2003 | Noble et al. |
| 6,642,109 B2 | 11/2003 | Lee et al. |
| 6,661,054 B1 | 12/2003 | Nakamura |
| 6,700,158 B1 | 3/2004 | Cao et al. |
| 6,710,403 B2 | 3/2004 | Sapp |
| 6,717,210 B2 | 4/2004 | Takano et al. |
| 6,756,274 B2 | 6/2004 | Williams et al. |
| 6,764,889 B2 | 7/2004 | Baliga |
| 6,770,539 B2 | 8/2004 | Sumida |
| 6,825,105 B2 | 11/2004 | Grover et al. |
| 6,861,701 B2 | 3/2005 | Williams et al. |
| 6,903,393 B2 | 6/2005 | Ohmi et al. |
| 6,919,610 B2 | 7/2005 | Saitoh et al. |
| 6,927,455 B2 | 8/2005 | Narazaki |
| 6,960,821 B2 | 11/2005 | Noble et al. |
| 6,987,305 B2 | 1/2006 | He et al. |
| 7,224,022 B2 | 5/2007 | Tokano et al. |
| 7,361,952 B2 | 4/2008 | Miura et al. |
| 7,375,029 B2 | 5/2008 | Poelzl |
| 7,397,083 B2 | 7/2008 | Amali et al. |
| 7,449,354 B2 | 11/2008 | Marchant et al. |
| 7,521,306 B2 | 4/2009 | Kubo et al. |
| 7,541,642 B2 | 6/2009 | Kawamura et al. |
| 7,544,568 B2 | 6/2009 | Matsuura et al. |
| 7,663,195 B2 | 2/2010 | Ohmi et al. |
| RE41,509 E * | 8/2010 | Kinzer et al. ............... 257/341 |
| 7,910,440 B2 | 3/2011 | Ohta et al. |
| 7,910,486 B2 | 3/2011 | Yilmaz et al. |
| 7,964,913 B2 | 6/2011 | Darwish |
| 8,080,459 B2 | 12/2011 | Xu |
| 8,367,500 B1 | 2/2013 | Xu et al. |
| 8,629,019 B2 | 1/2014 | Xu et al. |
| 2001/0026006 A1 | 10/2001 | Noble et al. |
| 2001/0026989 A1 | 10/2001 | Thapar |
| 2002/0036319 A1 | 3/2002 | Baliga |
| 2002/0038887 A1 | 4/2002 | Ninomiya et al. |
| 2002/0050847 A1 | 5/2002 | Taniguchi et al. |
| 2002/0074585 A1 | 6/2002 | Tsang et al. |
| 2002/0123196 A1 | 9/2002 | Chang et al. |
| 2002/0130359 A1 | 9/2002 | Okumura et al. |
| 2003/0030092 A1 | 2/2003 | Darwish et al. |
| 2003/0201483 A1 | 10/2003 | Sumida |
| 2004/0016959 A1* | 1/2004 | Yamaguchi et al. ......... 257/327 |
| 2004/0021174 A1 | 2/2004 | Kobayashi |
| 2004/0155287 A1 | 8/2004 | Omura et al. |
| 2004/0161886 A1 | 8/2004 | Forbes et al. |
| 2004/0173844 A1 | 9/2004 | Williams et al. |
| 2005/0001268 A1 | 1/2005 | Baliga |
| 2005/0026369 A1 | 2/2005 | Noble et al. |
| 2005/0029585 A1 | 2/2005 | He et al. |
| 2005/0079678 A1 | 4/2005 | Verma et al. |
| 2005/0167695 A1 | 8/2005 | Yilmaz |
| 2005/0184336 A1 | 8/2005 | Takahashi et al. |
| 2005/0266642 A1* | 12/2005 | Kubo et al. ............... 438/270 |
| 2006/0014349 A1 | 1/2006 | Williams et al. |
| 2006/0108635 A1 | 5/2006 | Bhalla et al. |
| 2006/0113577 A1 | 6/2006 | Ohtani |
| 2006/0113588 A1 | 6/2006 | Wu |
| 2006/0226494 A1* | 10/2006 | Hshieh ..................... 257/369 |
| 2006/0267090 A1 | 11/2006 | Sapp et al. |
| 2006/0273383 A1 | 12/2006 | Hshieh |
| 2006/0285368 A1 | 12/2006 | Schlecht |
| 2007/0007589 A1 | 1/2007 | Nakagawa |
| 2007/0013000 A1 | 1/2007 | Shiraishi |
| 2007/0023828 A1 | 2/2007 | Kawamura et al. |
| 2007/0138546 A1 | 6/2007 | Kawamura et al. |
| 2007/0155104 A1 | 7/2007 | Marchant et al. |
| 2007/0228496 A1 | 10/2007 | Rochefort et al. |
| 2007/0249142 A1 | 10/2007 | Hisanaga |
| 2008/0099344 A9 | 5/2008 | Basol et al. |
| 2008/0135931 A1 | 6/2008 | Challa et al. |
| 2008/0164515 A1 | 7/2008 | Li |
| 2008/0164517 A1 | 7/2008 | Ohta et al. |
| 2008/0173969 A1 | 7/2008 | Hebert et al. |
| 2008/0185640 A1* | 8/2008 | Nakagawa ................ 257/330 |
| 2008/0246081 A1 | 10/2008 | Li |
| 2009/0140327 A1* | 6/2009 | Hirao et al. .............. 257/328 |
| 2009/0159963 A1* | 6/2009 | Yamaguchi et al. ......... 257/328 |
| 2009/0166740 A1 | 7/2009 | Bhalla et al. |
| 2010/0055892 A1 | 3/2010 | Poelzl |
| 2010/0059797 A1 | 3/2010 | Ngai et al. |
| 2010/0181606 A1 | 7/2010 | Takaishi |
| 2011/0049614 A1 | 3/2011 | Gao et al. |
| 2011/0089486 A1 | 4/2011 | Xu et al. |
| 2012/0187474 A1 | 7/2012 | Rexer et al. |
| 2012/0313161 A1 | 12/2012 | Grivna et al. |

(56) References Cited

U.S. PATENT DOCUMENTS

| | | |
|---|---|---|
| 2012/0326229 A1 | 12/2012 | Poelzl et al. |
| 2014/0206165 A1 | 7/2014 | Li et al. |
| 2015/0108568 A1 | 4/2015 | Terrill et al. |

FOREIGN PATENT DOCUMENTS

| | | |
|---|---|---|
| DE | 102004036330 | 3/2005 |
| DE | 112005003584 | 4/2008 |
| EP | 0 133 642 A1 | 3/1985 |
| EP | 0354449 | 2/1990 |
| EP | 0 438 700 A1 | 7/1991 |
| EP | 0 583 022 A2 | 2/1994 |
| EP | 0 583 028 A1 | 2/1994 |
| EP | 0620588 | 10/1994 |
| EP | 0628337 | 12/1994 |
| EP | 0 746 030 A2 | 12/1996 |
| EP | 1 033 759 A2 | 9/2000 |
| EP | 1186023 | 3/2002 |
| EP | 1351313 | 10/2003 |
| EP | 1376674 | 1/2004 |
| EP | 1403914 | 3/2004 |
| GB | 2 269 050 A | 1/1994 |
| JP | 62-298152 | 12/1987 |
| JP | H03-173180 | 7/1991 |
| JP | H05-315620 | 11/1993 |
| JP | H06-350090 | 12/1994 |
| JP | H09-129877 | 5/1997 |
| JP | H09260645 | 10/1997 |
| JP | H10-032331 | 2/1998 |
| JP | H10-214809 | 8/1998 |
| JP | 2000-091344 | 3/2000 |
| JP | 2000-332246 | 11/2000 |
| JP | 2002-016080 | 1/2002 |
| JP | 2001016080 | 1/2002 |
| JP | 2002110978 | 4/2002 |
| JP | 2002-134705 | 5/2002 |
| JP | 2002190593 | 7/2002 |
| JP | 2002-246596 | 8/2002 |
| JP | 2002222950 | 8/2002 |
| JP | 2002-368221 | 12/2002 |
| JP | 2002-373988 | 12/2002 |
| JP | 2003030396 | 1/2003 |
| JP | 2003-515954 | 5/2003 |
| JP | 2003324196 | 11/2003 |
| JP | 2004-134793 | 4/2004 |
| JP | 2004522319 | 7/2004 |
| JP | 2005-142240 | 6/2005 |
| JP | 2005142240 * | 6/2005 |
| JP | 2005-524970 | 8/2005 |
| JP | 2005268679 | 9/2005 |
| JP | 2006-339558 | 12/2006 |
| JP | 2007027561 | 2/2007 |
| JP | 2007158275 | 6/2007 |
| JP | 2007-189192 | 7/2007 |
| JP | 2008042056 | 2/2008 |
| JP | 2008511982 | 4/2008 |
| JP | 2008171887 | 7/2008 |
| JP | 2009004411 | 1/2009 |
| JP | 2009-043966 | 2/2009 |
| JP | 2009522807 | 6/2009 |
| TW | 490853 B | 6/2002 |
| TW | I302028 B | 10/2008 |
| WO | 0065646 | 11/2000 |
| WO | 0141206 | 6/2001 |
| WO | 0199177 | 12/2001 |
| WO | 03010812 | 2/2003 |
| WO | 20040105116 | 2/2004 |
| WO | 20060058210 | 1/2006 |
| WO | 2006025035 | 3/2006 |
| WO | 2006126998 | 11/2006 |
| WO | 2007002857 | 1/2007 |
| WO | 2008156071 | 12/2008 |

OTHER PUBLICATIONS

"Effects on Selecting Channel Direction in Improving Performance of SUB-100 nm MOSFETs Fabricated on (110) Surface Si Substrate" Japanese Journal of Applied Physics, Part 1, vol. 43, No. 4B, Apr. 2004 pp. 1723-1728 (Nakamura et al.), XP00122768.

Masakatsu Hoshi et al., "A DMOSFET Having a Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.

Y. C. Pao et al., "(110)-Oriented GaAs MESFET's", IEEE Electron Device Letters, vol. 9, No. 3, pp. 119-121, Mar. 1988.

L. Parechanian-Allen et al., "Surface Faceting of (110) GaAs: Analysis and Elimination", presented at the Material Research Society Fall Conference, Session I, Boston, MA, Dec. 1, 1986, Lawrence Berkeley Laboratory Jniversity of California, Berkeley, California, LBL-22577.

L. Parechanian-Allen et al., "Device Quality Growth and Characterization of (110) GaAs Grown by Molecular Beam Epitaxy", submitted to Applied Physics Letters, Nov. 1986, Lawrence Berkeley Laboratory University of California, Berkeley, California, LBL-22564.

* cited by examiner

SUPER JUNCTION TRENCH POWER MOSFET DEVICE FABRICATION

This application is related to the co-pending U.S. patent application with Ser. No. 12/548,841, filed Aug. 27, 2009, by Gao et al., and entitled "Super Junction Trench Power MOSFET Devices," assigned to the assignee of the present application.

FIELD OF THE INVENTION

Embodiments in accordance with the present invention generally pertain to the fabrication of semiconductor devices.

BACKGROUND

To conserve power, it is important to reduce power losses in transistors that are used, for example, in direct current (DC) to DC converters. In a metal oxide semiconductor field effect transistor (MOSFET) device, and in particular in the class of MOSFETs known as power MOSFETs, power losses can be reduced by reducing the device's on-resistance (Rdson).

Breakdown voltage provides an indication of a device's ability to withstand breakdown under reverse voltage conditions. Because breakdown voltage is inversely related to Rdson, it is adversely affected when Rdson is reduced. To address this problem, super junction (SJ) power MOSFETs, which include alternating p-type and n-type regions below the active regions of the device, were introduced. The alternating p-type and n-type regions in a SJ power MOSFET are ideally in charge balance ($Q_p = Q_n$) so that those regions deplete one another under a reverse voltage condition, thereby enabling the device to better withstand breakdown.

SUMMARY

Even though conventional SJ power MOSFETs provide advantages such as the one described above, there is room for improvement. For example, in conventional SJ trench power MOSFET devices, the p-type columns and n-type columns that form the super junction may diffuse into one another when they are heated during fabrication; this diffusion will reduce the breakdown voltage. Also, the p-type columns are floating so that carriers in those columns cannot be removed rapidly, and thus conventional SJ trench power MOSFET devices are generally considered to be unsuitable for use in high speed circuits. Furthermore, the density of the active devices is limited in conventional SJ trench power MOSFET devices by the placement of each trench gate; for example, in a conventional n-channel device, the trench gate is placed between two p-type columns (that is, the gate is placed over an n-type column).

As noted above, an SJ trench power MOSFET device includes a super junction that includes alternating columns of p-type dopant and n-type dopant. In one embodiment according to the invention, in forming a super junction for an n-channel device, a column of p-type dopant is formed, a layer or column of oxide is deposited on opposite sides of that column, and columns of n-type dopant are formed adjacent to the columns of oxide; in forming a super junction for a p-channel device, a column of n-type dopant is formed, a layer or column of oxide is deposited on opposite sides of that column, and columns of p-type dopant are formed adjacent to the columns of oxide. Thus, the super junction includes a column of one type of dopant that, on one side, is separated from a first column of another type of dopant by a first column (or layer) of oxide and, on its other side, is separated from a second column of the other type of dopant by a second column (or layer) of oxide. The oxide layers keep the adjacent n-type and p-type columns from diffusing into one another when the device is heated during fabrication. Hence, the oxide layers can prevent breakdown voltage from being adversely affected by the fabrication process.

In another embodiment, in forming an n-channel device, the source metal is electrically shorted to a p-type column in the super junction, so that the carriers in the p-type column can be swept away rapidly when the resultant body diode is switched from on to off; in a p-channel device, an n-type column in the super junction is picked up and shorted to a source to similar advantage. Accordingly, a SJ trench power MOSFET device with this feature is better suited for use in high speed circuits.

In another embodiment, in an n-channel device, a super junction is formed and a gate element (e.g., a trench gate) for a FET is formed on the super junction such that the gate element is above a region of p-type dopant in the super junction instead of over a column of n-type dopant. By aligning the gates with the p-type columns, the width of the n-type columns can be reduced. In a p-channel device, gate elements for the FETs are situated over columns of n-type dopant in the super junction instead of over columns of p-type dopant so that the widths of the p-type columns can be reduced. Accordingly, the trench gates can be placed closer together, increasing the cell density, which also has the effect of further reducing the on-resistance (Rdson) of the SJ trench power MOSFET device.

These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification.

DETAILED DESCRIPTION

Figure 1:
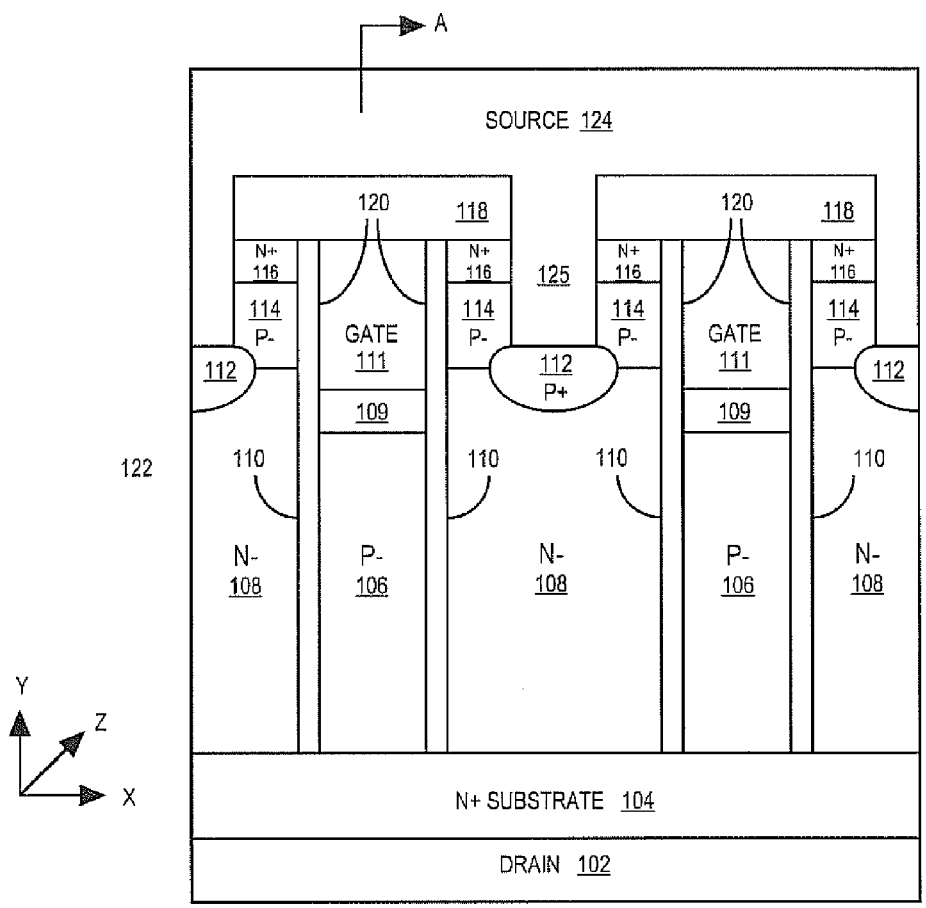
FIGS. 1 and 2 are cross-sectional views showing elements of semiconductor devices according to embodiments of the present invention.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching" or the like, refer to actions and processes (e.g., flowchart 300 of FIGS. 3A, 3B, and 3C) of semiconductor device fabrication.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the present invention can be implemented in conjunction with these other (perhaps conventional) processes and steps without significantly perturbing them. Generally speaking, embodiments in accordance with the present invention can replace portions of a conventional process without significantly affecting peripheral processes and steps.

As used herein, the letter "n" refers to an n-type dopant and the letter "p" refers to a p-type dopant. A plus sign "+" or a minus sign "−" is used to represent, respectively, a relatively high or relatively low concentration of the dopant.

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. FIGS. 1-25 are discussed in the context of an n-channel device, specifically an n-channel super junction MOSFET; however, embodiments according to the present invention are not so limited. That is, the features described herein can be utilized in a p-channel device as shown in FIG. 26, described further below. The discussion of FIGS. 1-25 can be readily mapped to a p-channel device by substituting n-type dopant and materials for corresponding p-type dopant and materials, and vice versa.

FIG. 1 is a cross-sectional view showing elements of a semiconductor device 100 (e.g., an n-channel SJ trench power MOSFET device) according to an embodiment of the present invention. The device 100 includes a drain electrode 102 on the bottom surface of an n+ drain layer or substrate 104. Alternating p− drift regions or p-type columns 106 and n− drift regions or n-type columns 108 are located above the substrate 104. The alternating p-type (p−) columns 106 and n-type (n−) columns 108 form what is known as a super junction. Significantly, the columns 106 of p-type dopant are separated from the adjacent columns 108 of n-type dopant by isolation layers or columns 110 (e.g., a layer/column of dielectric or oxide). The isolation layers 110 keep the n-type and p-type columns 106 and 108 from diffusing into one another when the structure is heated during fabrication, as described below. Hence, the isolation layers 110 can prevent breakdown voltage from being adversely affected by the fabrication process.

Also of significance, in the example of FIG. 1, each p-type column 106 is located under a respective polysilicon (poly) trench gate 111 (gate poly 111). Generally speaking, each trench gate 111 is aligned between adjacent isolation layers 110 and above a corresponding p-type column 106. More specifically, each trench gate 111 is aligned along the longitudinal axis of a corresponding p-type column 106 (given the orientation of FIG. 1, the longitudinal axis is a vertical line within a p-type column)—in one embodiment, the longitudinal axis of a trench gate 111 coincides with the longitudinal axis of a p-type column 106 such that the trench gate is centered over the p-type column. In the FIG. 1 embodiment, the p-type columns 106 are separated from the trench gates 111 by a respective isolation layer 109, which may be formed of a material that is different from the material used for the isolation layers 110.

By aligning the trench gates 111 with the p-type columns 106, the width of the n-type columns 108 can be reduced. Accordingly, the trench gates can be placed closer together, increasing the cell density, which also has the effect of further reducing the on-resistance (Rdson) of the device 100. In one embodiment, the pitch between adjacent trench gates is approximately 1.2 microns, as opposed to five microns in conventional devices.

Another advantage associated with the structure in FIG. 1 is that the gate-to-drain charge (Qgd) is reduced because the amount of overlap 122 between a trench gate 111 and an adjacent n-type column 108 is small. In one embodiment, the amount of overlap 122 is approximately 0.1 microns.

In the FIG. 1 embodiment, a trench 125 is formed between adjacent trench gates 111, above the n-type columns 108. More specifically, each trench 125 is aligned along the longitudinal axis of a corresponding n-type column 108—in one embodiment, the longitudinal axis of a trench 125 coincides with the longitudinal axis of an n-type column 108 such that the trench is centered over the n-type column. The trench 125 is filled with a source metal 124.

A p+ region (p-type contact region 112) separates the source metal 124 in each trench 125 from a corresponding n-type column 108. A p− region (p-type body region 114) is situated on each side of each trench 125, between the trench and a trench gate 111 and also between the source metal 124 and an n-type column 108. Also, n+ regions (n-type source regions 116) are situated on opposite sides of each trench 125 as shown in FIG. 1.

The p-type (p−) body regions 114 and n-type (n+) source regions 116 are separated from a respective trench gate 111 by another isolation layer 120 (e.g., a gate oxide). As will be seen, the isolation layers 110 and 120 are formed at different points in the fabrication process and so may not be aligned as shown in FIG. 1. Also, the isolation layers 110 and 120 may be made using different materials. Nevertheless, the isolation layers 110 and 120 provide a nearly continuous boundary in the y-direction of FIG. 1, and in that sense can be characterized as single columns of isolation material.

An insulating layer 118 can be formed over each n-type source region 116 and each trench gate 111. The source metal layer 124 is formed over the insulating layer 118 and, as mentioned above, extends into the trenches 125.

According to an embodiment of the invention, the p-type columns 106 are picked up and electrically shorted to the source metal layer 124. One way to accomplish this is shown in FIG. 2, which is a cross-sectional view of the device 100 along the cut line A-A of FIG. 1; that is, the view presented in FIG. 2 is in the third dimension (z) orthogonal to the two dimensions (x and y) shown in FIG. 1.

Figure 2:
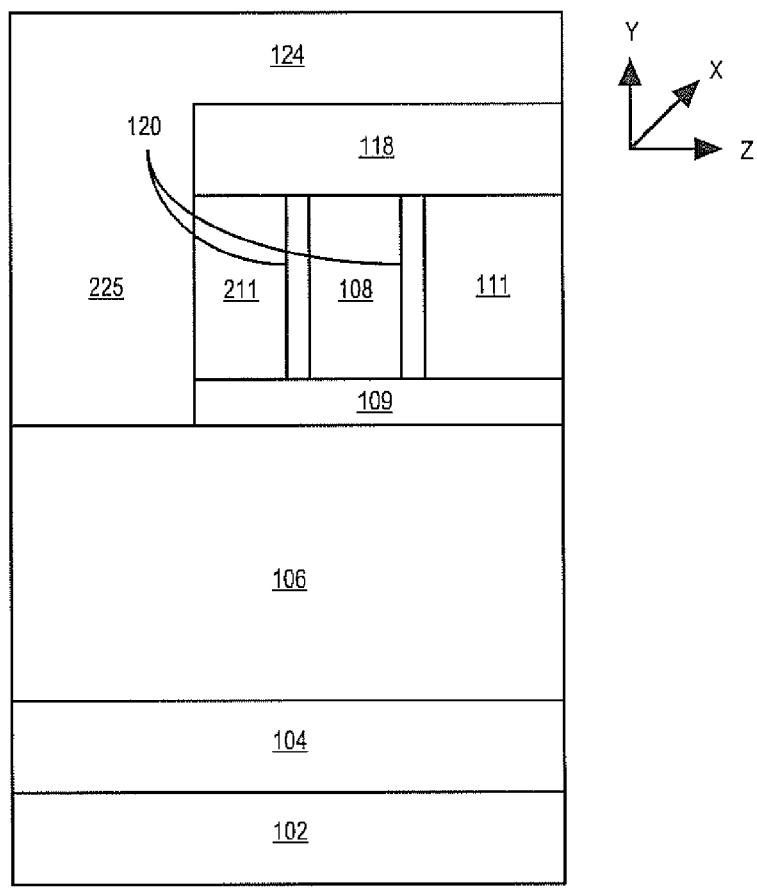

In the FIG. 2 embodiment, a trench 225 is formed to connect a corresponding p-type column 106 to the source metal layer 124. The trench 225 is filled with metal, and the metal in the trench 225 is separated from the trench gate 111 by the n-type column 108, a poly region 211, and isolation layers 120, as shown in the figure. By shorting the p-type columns 106 to the source metal layer 124, the carriers in the p-type columns can be swept away rapidly when the resultant body diodes are switched from on to off. Accordingly, the device 100 is better suited for use in high speed circuits.

Figure 3A:
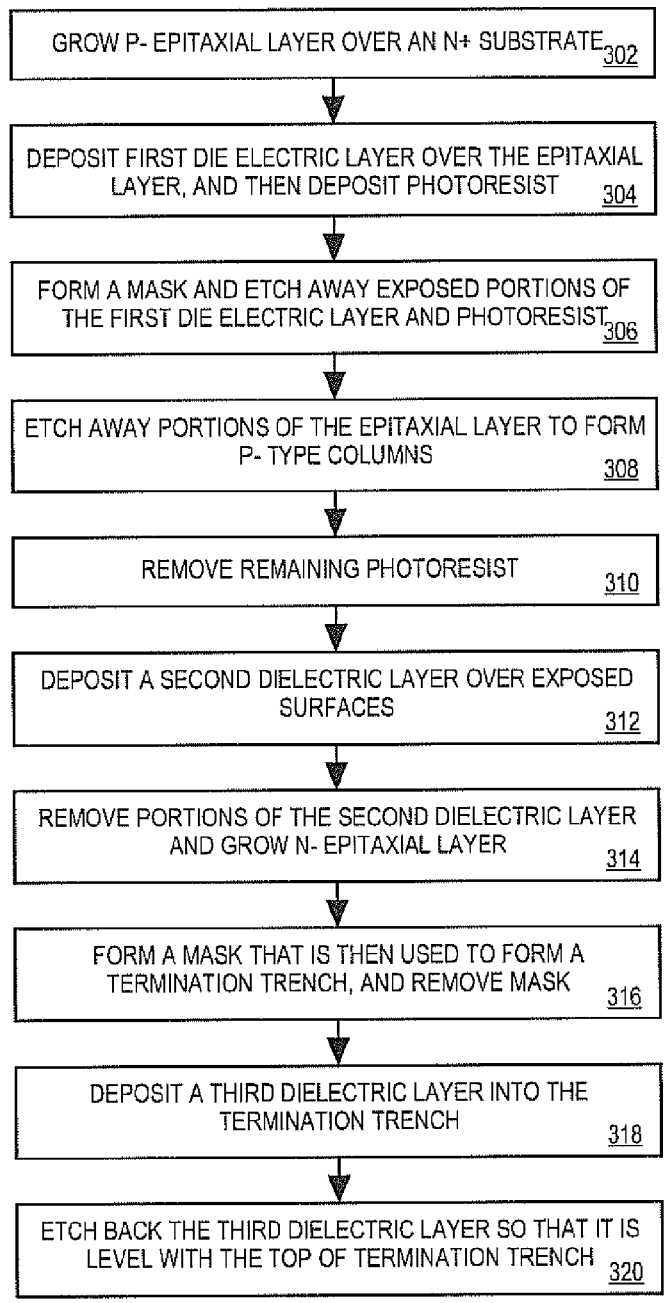
FIGS. 3A, 3B, and 3C illustrate a flowchart of a process that is used in the fabrication of a semiconductor device according to embodiments of the present invention.
Figure 3B:
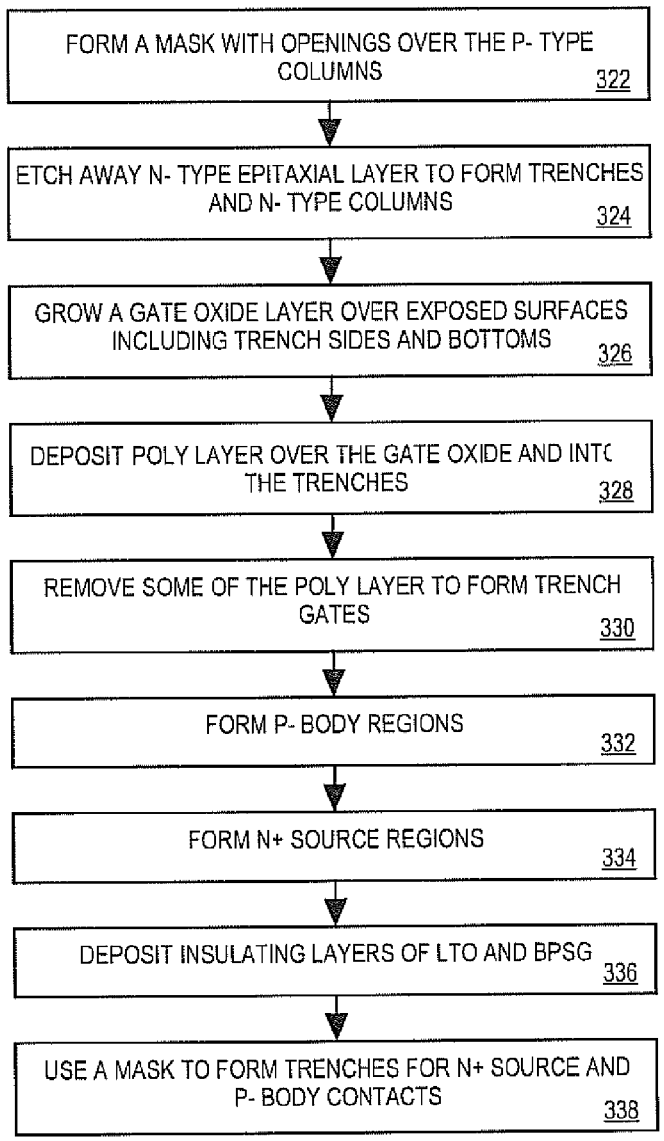
Figure 3C:
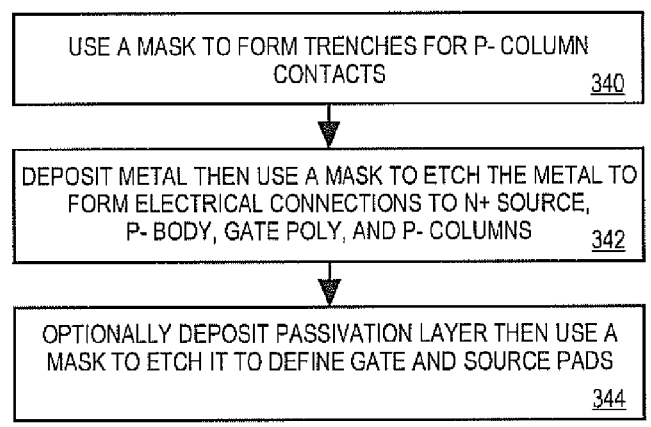
Figure 4:
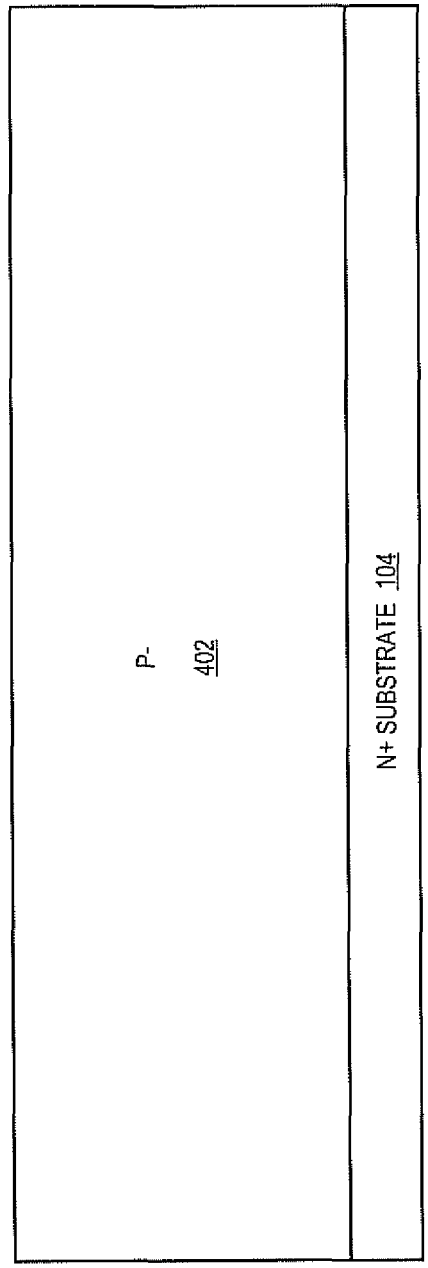
FIGS. 4, 5, 6, 7, 8, 9, 10, 11, 12, 13, 14, 15, 16, 17, 18, 19, 20, 21, 22, 23, 24, and 25 are cross-sectional views showing selected stages in the fabrication of a semiconductor device according to embodiments of the present invention.

FIGS. 3A, 3B, and 3C illustrate a flowchart 300 of one embodiment of a process that is used in the fabrication of semiconductor devices such as the devices of FIGS. 1 and 2. Although specific steps are disclosed in FIGS. 3A-3C, such steps are exemplary. That is, embodiments according to the present invention are well suited to performing various other steps or variations of the steps recited in FIGS. 3A-3C. FIGS. 3A, 3B, and 3C are discussed in conjunction with FIGS. 4 through 25, which are cross-sectional views showing selected stages in the fabrication of a semiconductor device according to an embodiment of the present invention.

In block 302 of FIG. 3A, an epitaxial layer 402 (FIG. 4) of p– dopant is grown over an n+ substrate 104. The substrate 104 may include a drain electrode layer 102 (FIG. 1).

Figure 5:
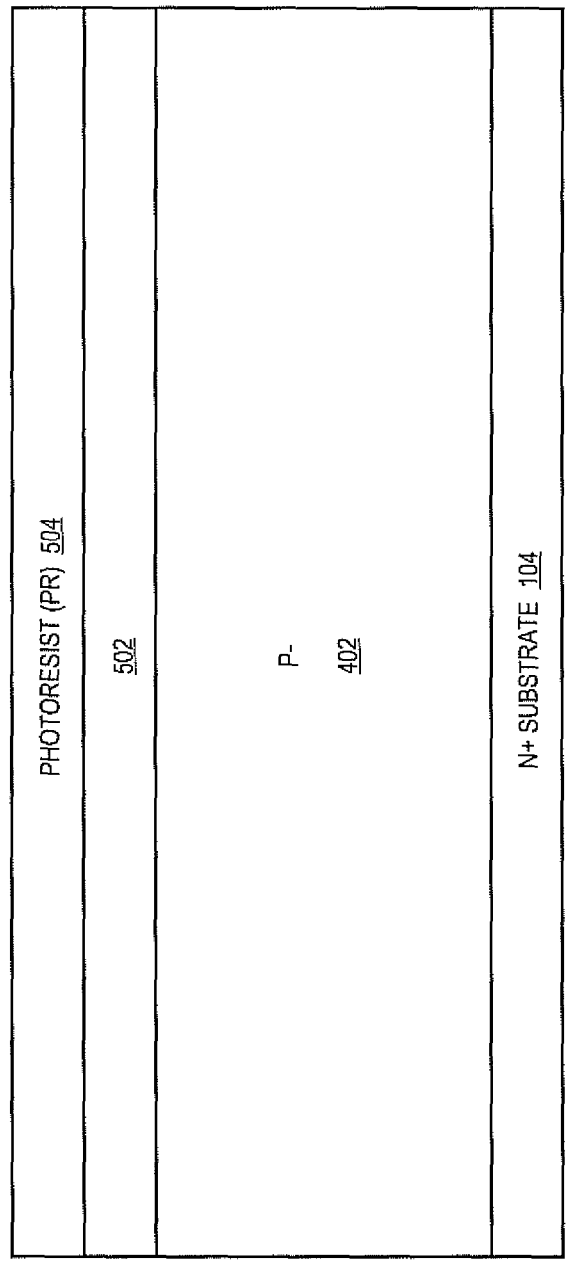

In block 304, a first dielectric layer 502 is deposited over the epitaxial layer 402, and a layer 504 of photoresist (PR) is deposited over the dielectric layer (FIG. 5). The dielectric layer 502 may be, for example, a thermal oxide or an oxide deposited via sub-atmospheric pressure chemical vapor deposition (SACVD).

Figure 6:
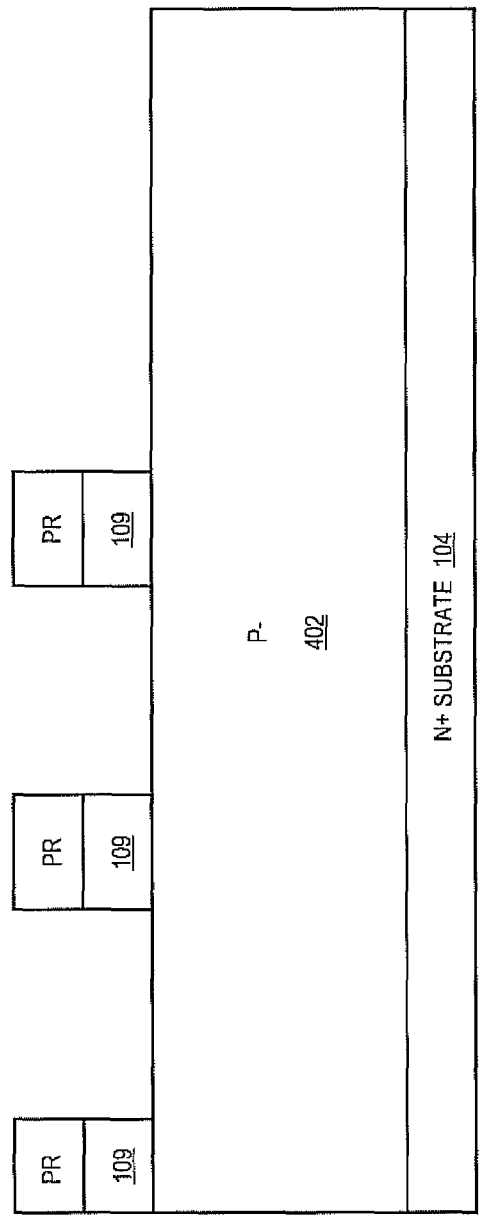

In block 306, a first mask (not shown) is formed, and exposed portions of the photoresist layer 504 and dielectric layer 502 are etched away as shown in FIG. 6. The remaining portions of the dielectric layer 502 correspond to the isolation layers 109 of FIG. 1.

Figure 7:
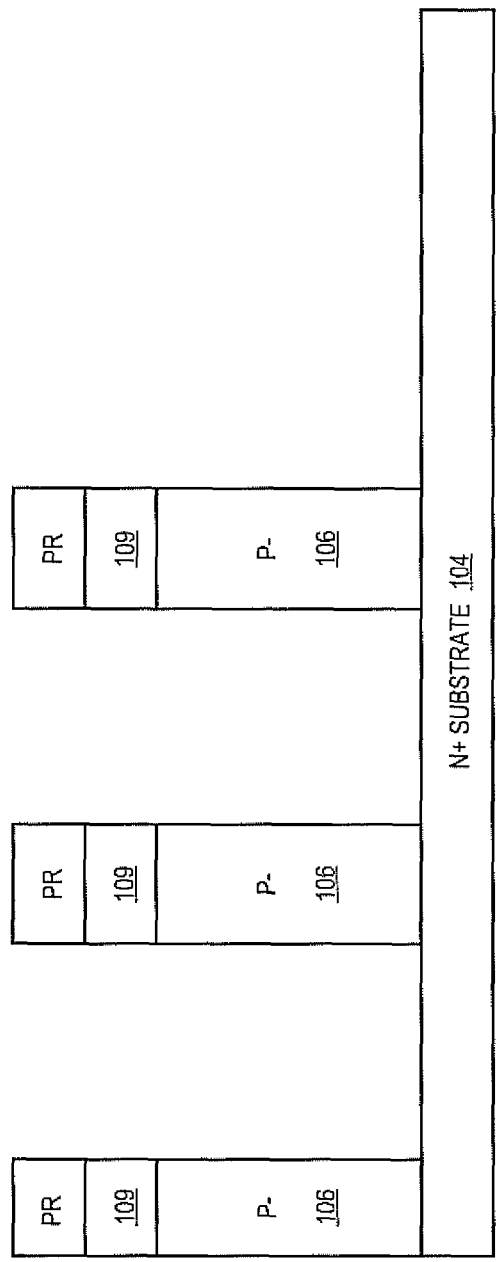
Figure 8:
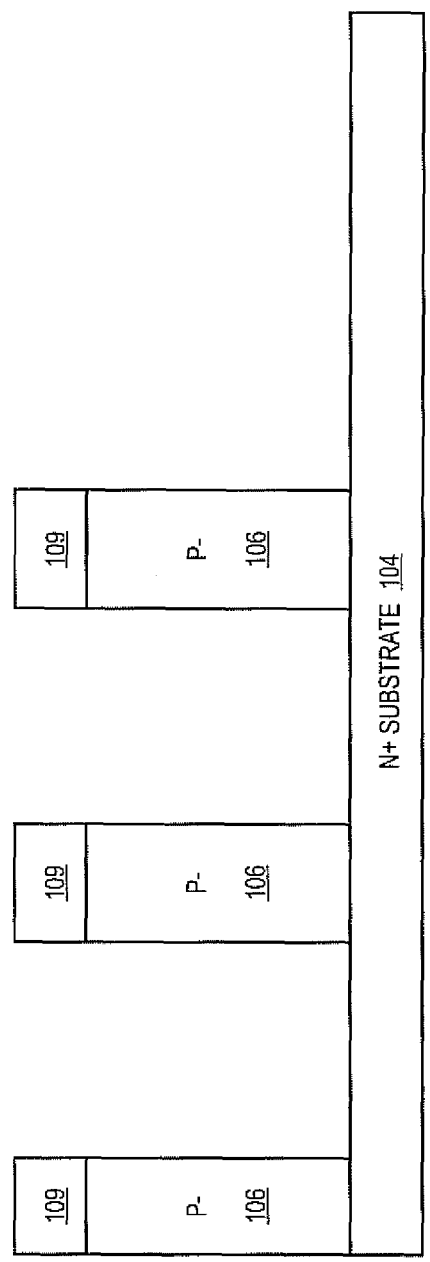

In block 308, portions of the p-type epitaxial layer 402 are also etched away, forming the p-type columns 106 as shown in FIG. 7. The etch of the epitaxial layer 402 may extend to a relatively slight extent into the substrate 104. The etching material applied in block 308 may be different from that used in block 306. In block 310, the remaining photoresist layer 504 is removed (FIG. 8).

In block 312 of FIG. 3A, a second dielectric layer 902 (FIG. 9) is grown or deposited over the exposed surfaces of the isolation layers 109 and the p-type columns 106. In particular, the dielectric layer 902 is formed on opposite sides of the p-type columns 106 as well as over the isolation layers 109, in effect forming layers or columns of dielectric material on either side of the p-type columns. The material used for the second dielectric layer 902 may be different from that used for the isolation layers 109. Also, the second dielectric layer 902 may be relatively thin (on the order of 300-500 Angstroms) in comparison to the thickness of the isolation layers 109.

Figure 9:
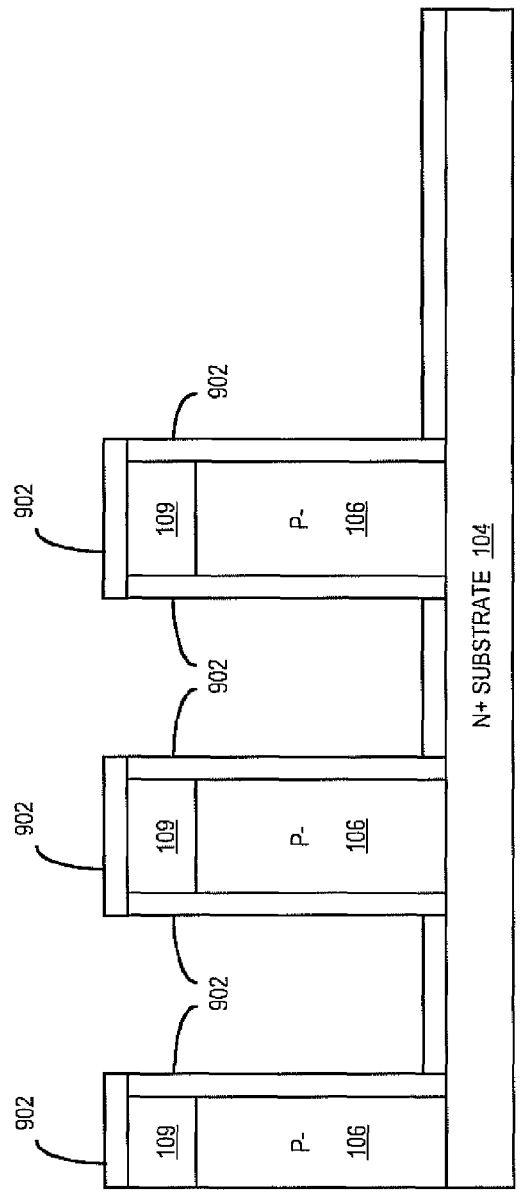
Figure 10:
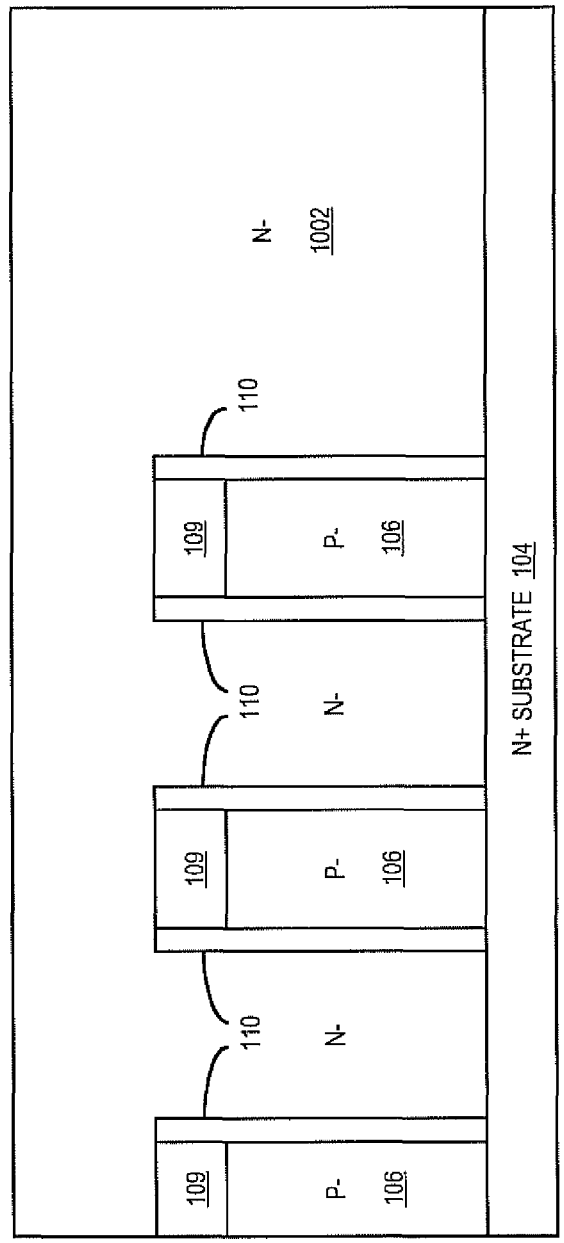

In block 314 of FIG. 3A, the portion of the dielectric layer 902 (FIG. 9) that is adjacent to the substrate 104 is removed as shown in FIG. 10, a process that may be referred to as bottom oxide breakthrough. The portions of the dielectric layer 902 on either side of the p-type columns 106 are not removed; those portions correspond to the isolation layers 110 of FIG. 1. The portions of the dielectric layer 902 that are over the isolation layers 109 may also be removed in part or in entirety as part of the bottom oxide breakthrough process. In other words, after bottom oxide breakthrough, the substrate 104 is exposed as shown in FIG. 10, while the isolation layers 109 may consist of either only the material deposited as part of the first dielectric layer 502 (FIG. 5) or a combination of the materials included in the first dielectric layer 502 and the second dielectric layer 902. Also in block 314, after bottom oxide breakthrough, an epitaxial layer 1002 of n– dopant is grown over the substrate 104 and around the structures comprising the p-type columns 106 and isolation layers 109 and 110.

Figure 11:
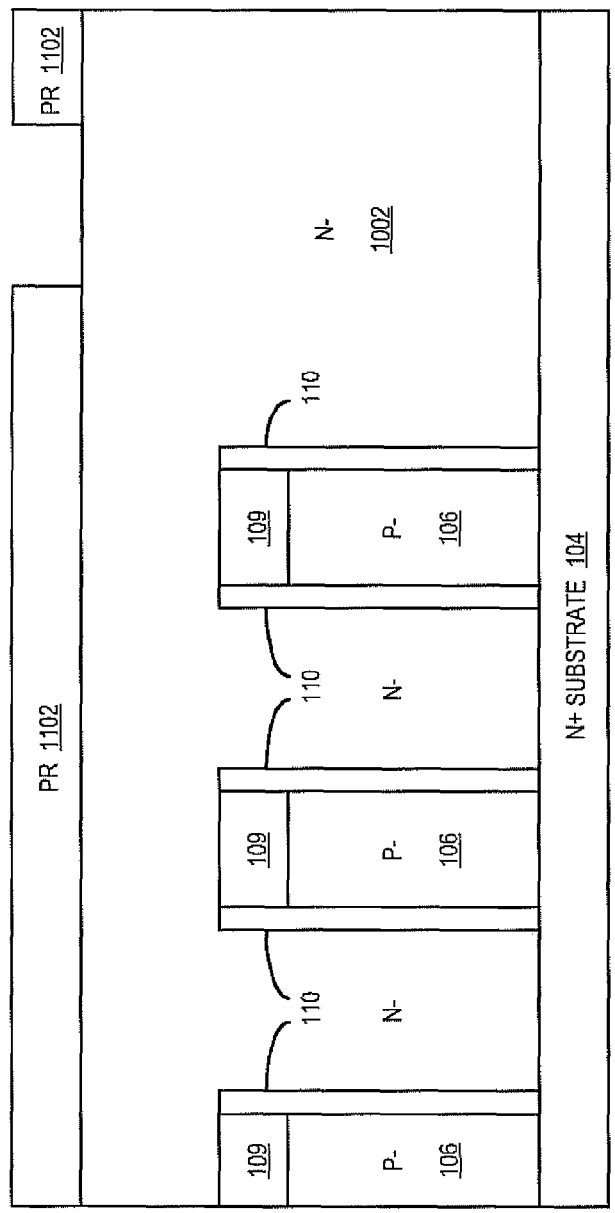
Figure 12:
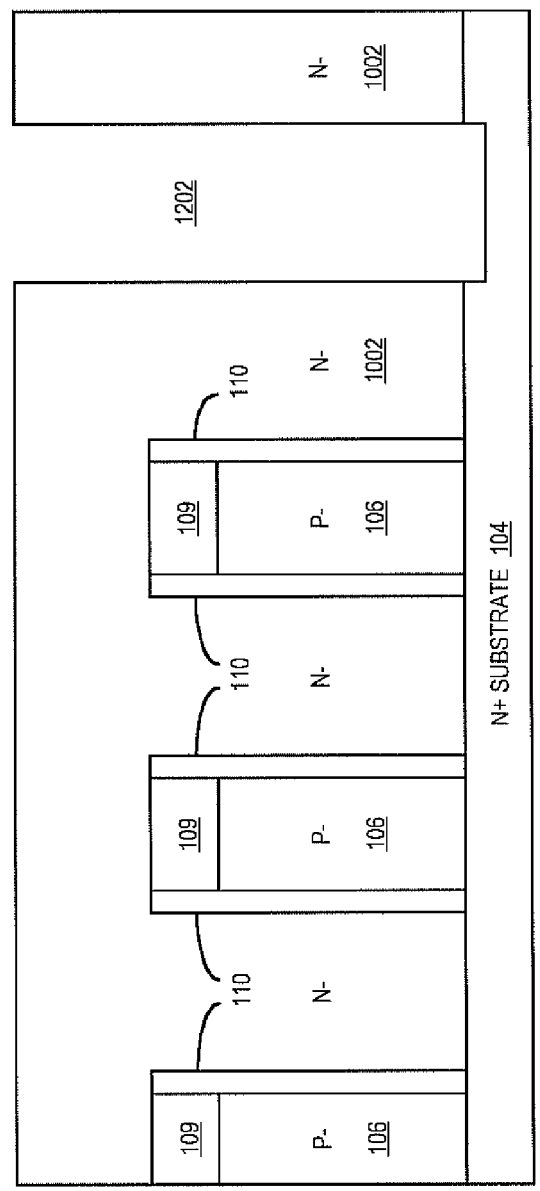

In block 316 of FIG. 3A, a layer of photoresist is applied and then selectively removed to form a mask 1102 as shown in FIG. 11. The mask 1102 will be used to form a termination trench 1202 in the n-type epitaxial layer 1002 as shown in FIG. 12. The termination trench 1202 may extend into the substrate 104. The mask 1102 can then be removed, also as shown in FIG. 12.

Figure 13:
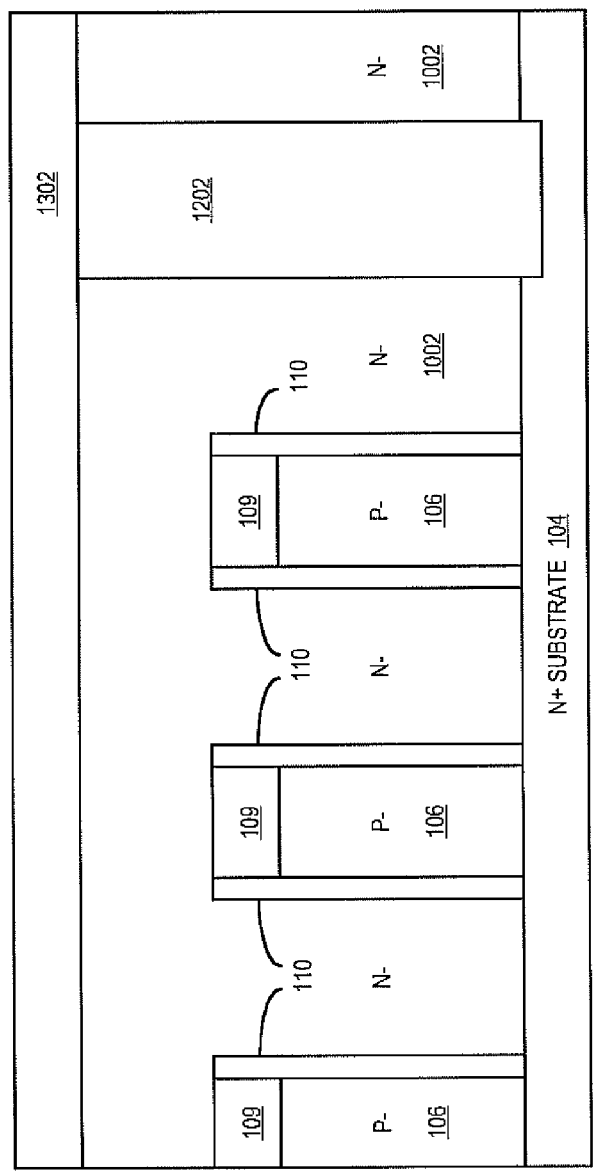

In block 318 of FIG. 3A, a third dielectric layer 1302 is grown or deposited (e.g., using SACVD) inside the termination trench 1202 and over the n-type epitaxial layer 1002 as shown in FIG. 13. The material used for the third dielectric layer 1302 may be different from the material(s) used for the isolation layers 109 and 110. The third dielectric layer 1302 can then be cured or annealed using a densification process. Importantly, the isolation layers 110 prevent or limit the diffusion of the p-type columns 106 and the n-type epitaxial layer 1002 into one another during the densification process and at any other time in the fabrication process during which the structure may be heated.

Figure 14:
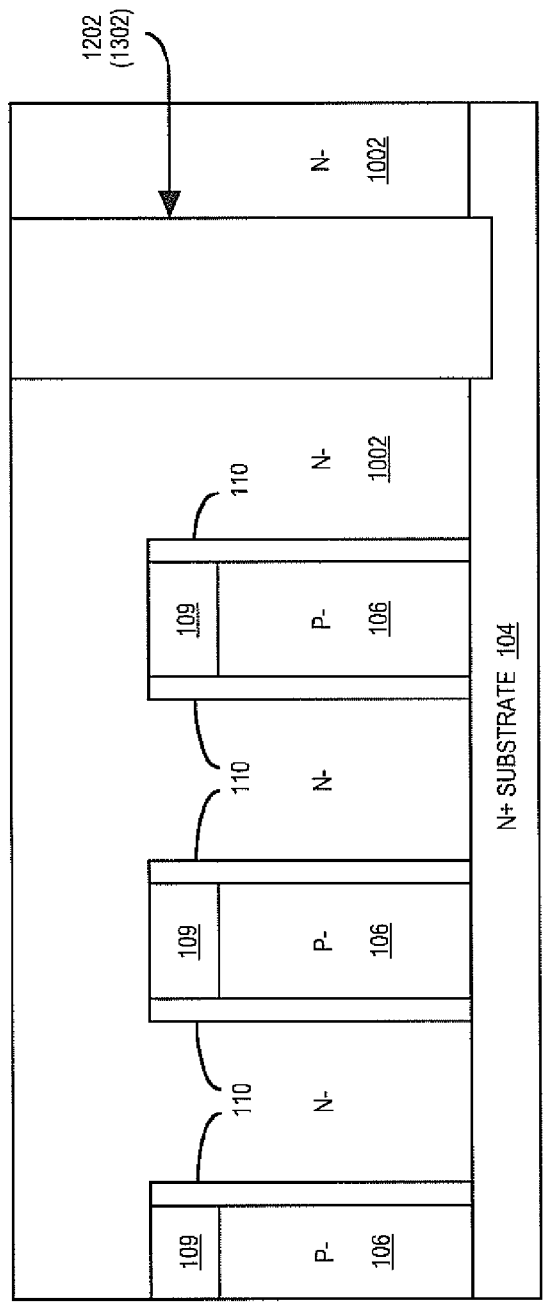

In block 320 of FIG. 3A, the dielectric layer 1302 is etched back such that the level of dielectric in the termination trench 1202 is essentially level with the upper surface of the n-type epitaxial layer 1002 as shown in FIG. 14.

Figure 15:
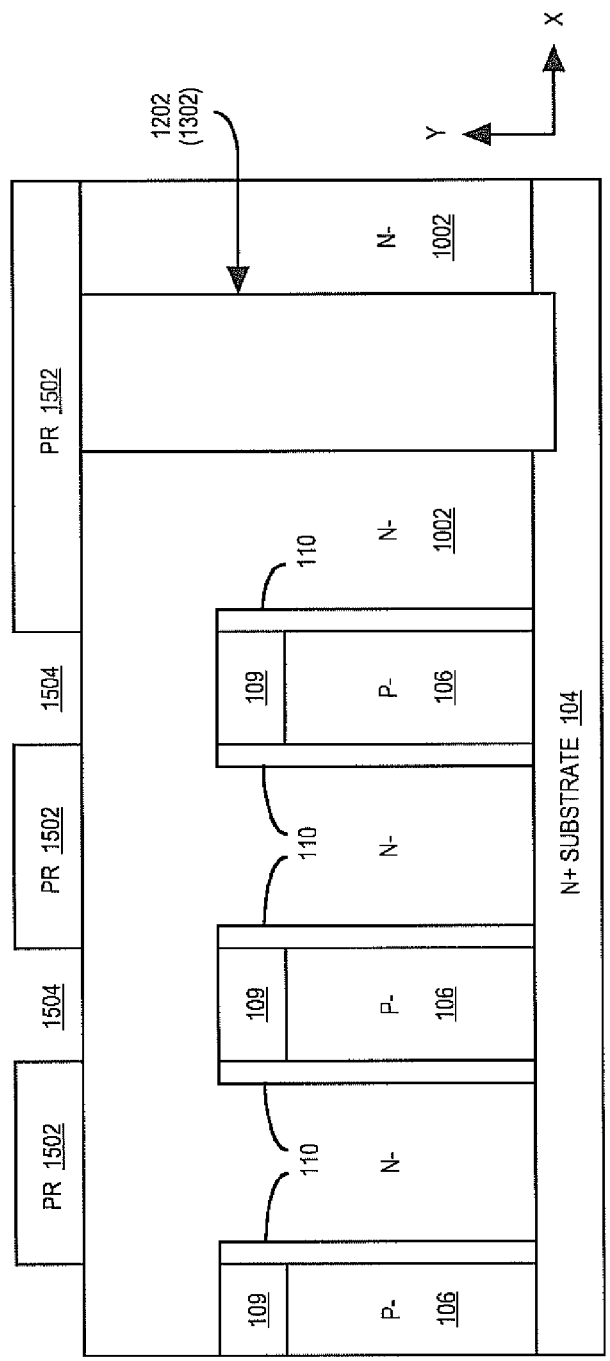

In block 322 of FIG. 3B, a layer of photoresist is applied and then selectively removed to form a mask 1502 as shown in FIG. 15. The openings 1504 in the mask coincide with the locations of the p-type columns 106. The widths of the openings 1504 (measured in the x-direction of FIG. 15) may be less than the widths of the p-type columns 106 in order to avoid issues with the alignment of the openings and the p-type columns. In other words, as will be seen, the mask 1502 will be used to form trenches over the p-type columns 106, and ideally those trenches will not extend beyond the outer edges of the p-type columns.

Figure 16:
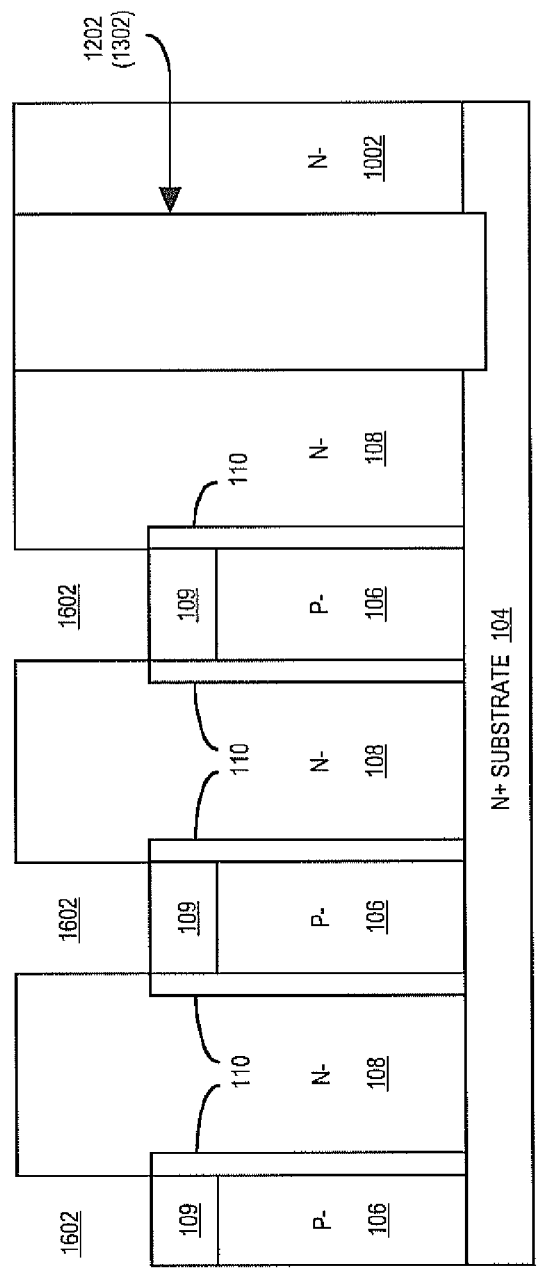
Figure 17:
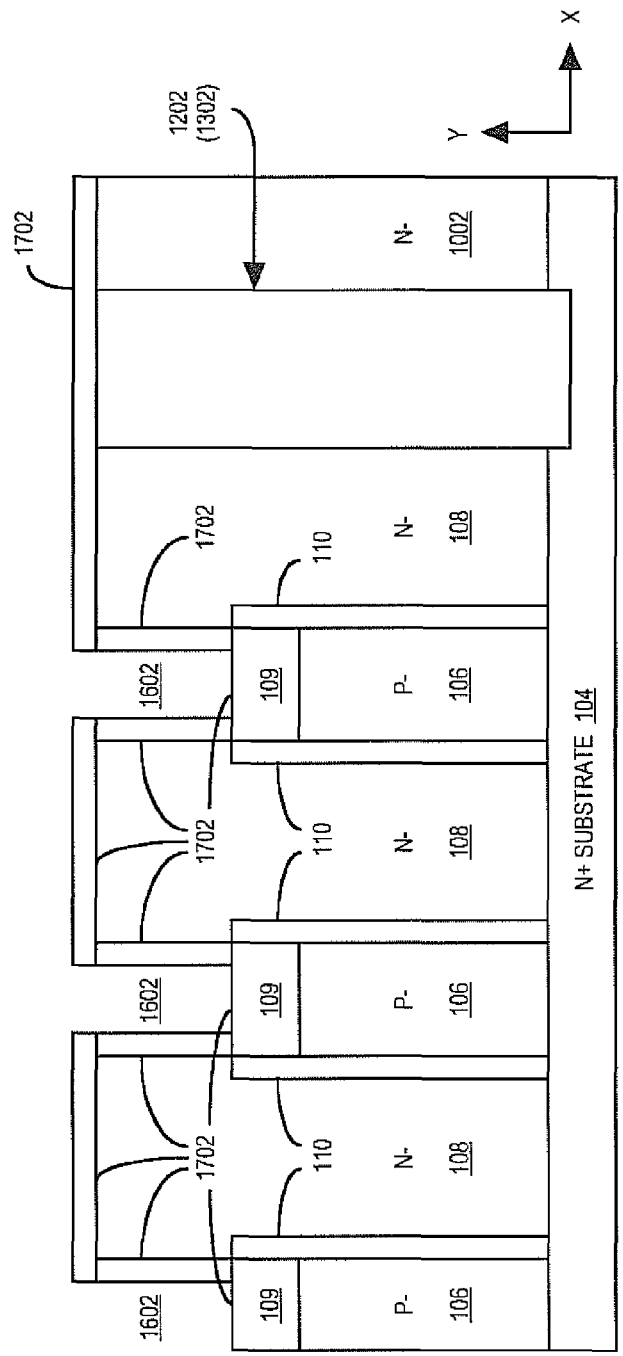

In block 324 of FIG. 3B, with reference to FIGS. 15 and 16, the portions of the n-type epitaxial layer 1002 underlying the openings 1504 are etched away, forming trenches 1602 that extend to the isolation layers 109. The portions of the epitaxial layer 1002 that are not etched away correspond to the n-type columns 108 of FIG. 1. The mask 1502 can then be removed.

In block 326 of FIG. 3B, a gate oxide layer 1702 (FIG. 17) is grown over the exposed surfaces of the isolation layers 109 and n-type columns 108, including the sides and bottoms of the trenches 1602. The material used for the gate oxide layer 1702 may be different from the material(s) included in the first dielectric layer 502 (FIG. 5) and the second dielectric layer 902 (FIG. 9). The isolation layers 109 of FIG. 1 may include the gate oxide layer 1702 as well as material(s) from the first dielectric layer 502 and the second dielectric layer 902—in other words, although depicted in the figures as a single homogeneous layer, in actual practice the isolation layers 109 may include different isolation materials. Furthermore, depending on the widths of the trenches 1602, the portions of the gate oxide layer 1702 that line those trenches may coincide with the isolation layers 110, forming essentially continuous columns of isolation material in the vertical (y-direction) of FIG. 17.

Figure 18:
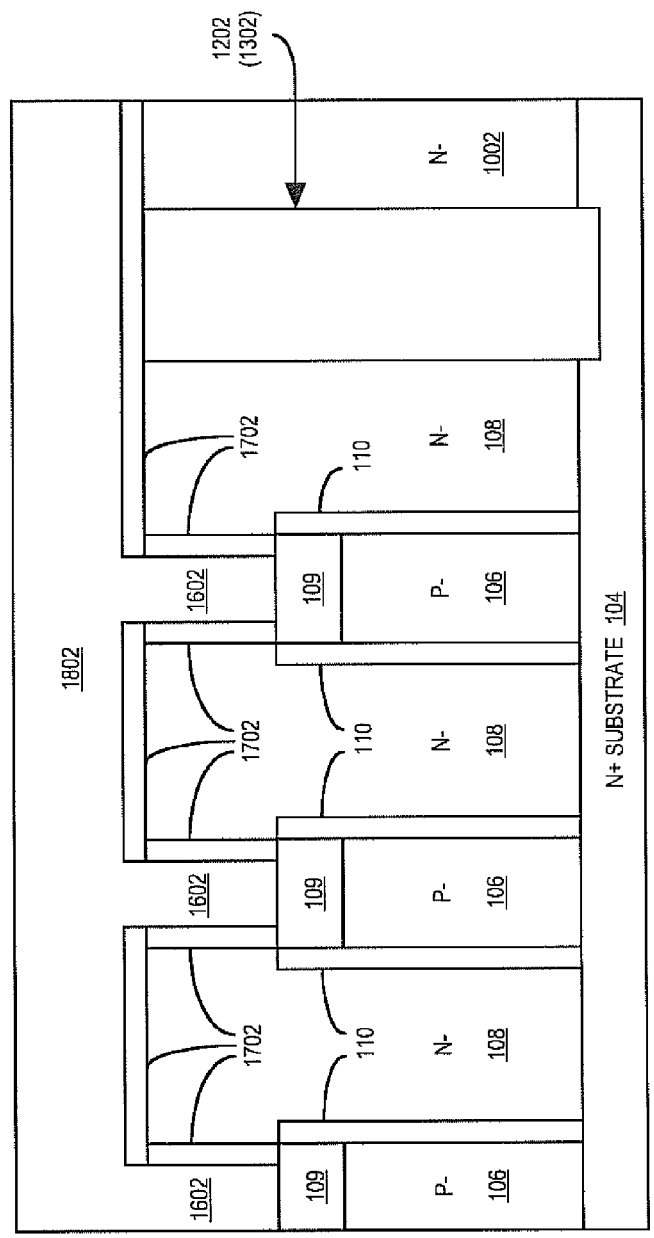

In block 328 of FIG. 3B, a polysilicon (poly) layer 1802 is deposited over the gate oxide layer 1702 and into the trenches 1602 as shown in FIG. 18.

Figure 19:
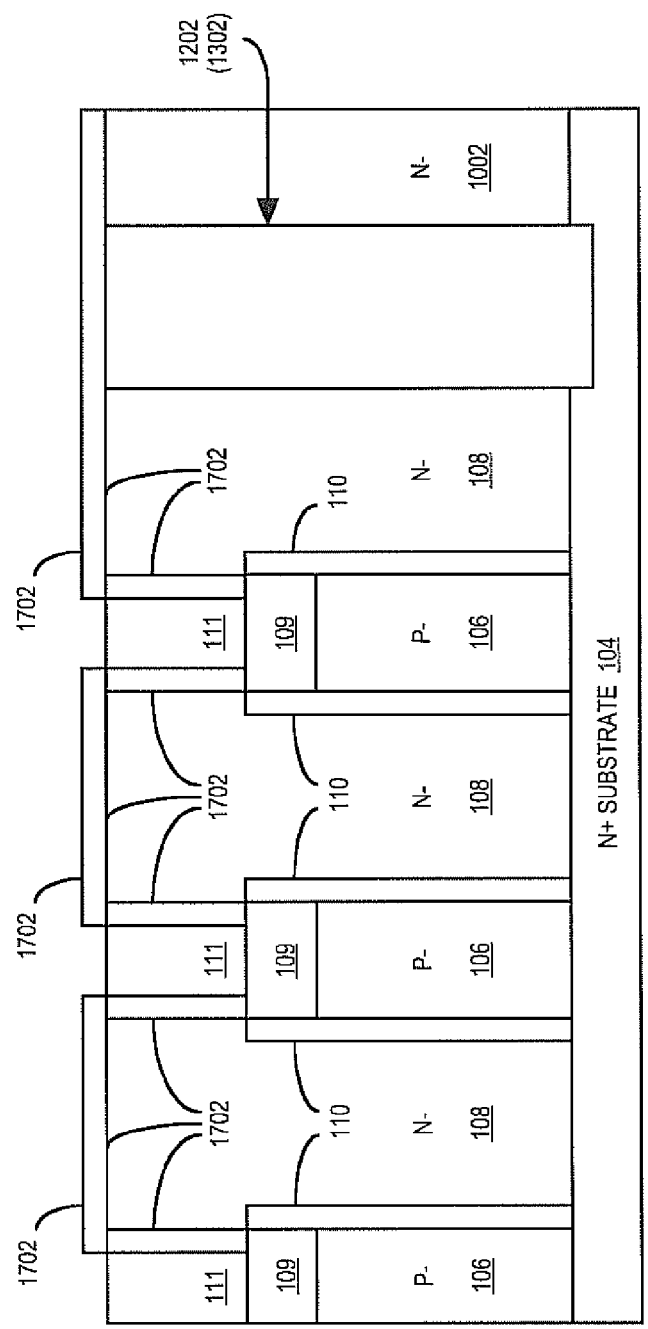

In block 330 of FIG. 3B, a chemical-mechanical planarization or polishing (CMP) process can be used to remove some of the poly layer 1802 (FIG. 18), down to the gate oxide layer 1702. An etch back process can then be used to remove more of the poly layer 1802, to form recessed elements as shown in FIG. 19. These recessed elements correspond to the trench gates 111 of FIG. 1.

Figure 20:
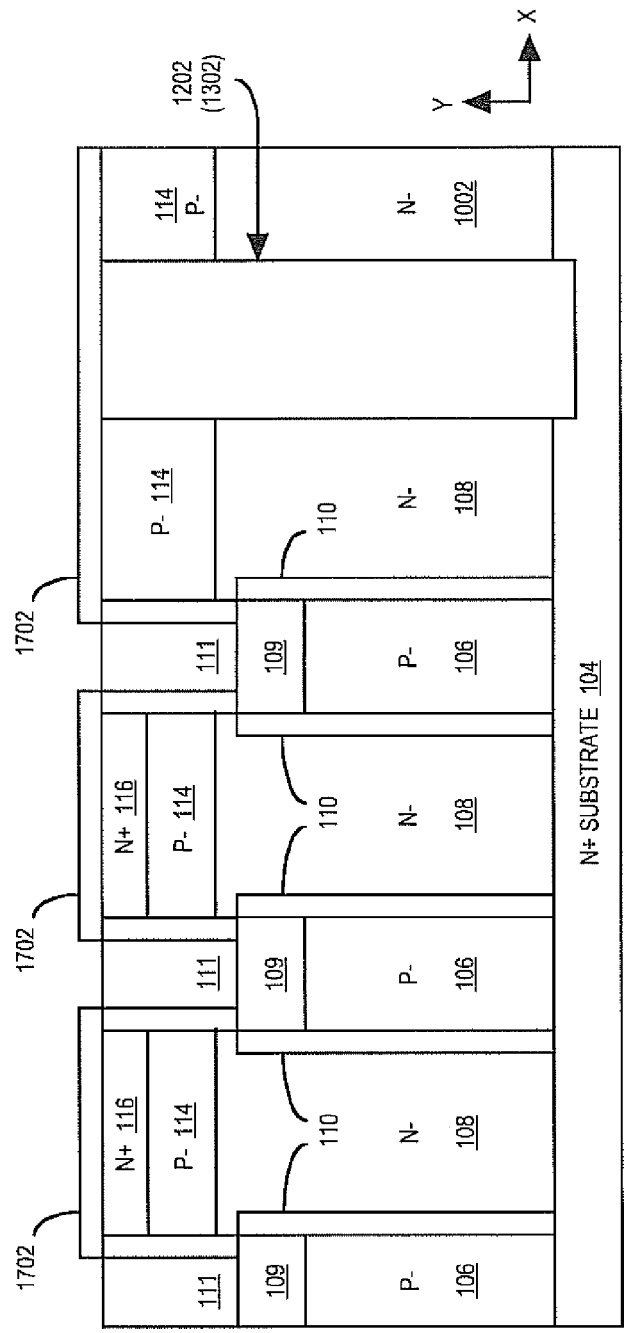

In block 332 of FIG. 3B, with reference also to FIG. 20, a blanket p-dopant is implanted into the device 100—that is, into the n-type columns 108—to form the p-type (p–) body regions 114 of FIG. 1. The p-type body regions 114 are shallower in depth (in the y-direction of FIG. 20) than the trench gates 111.

Figure 21:
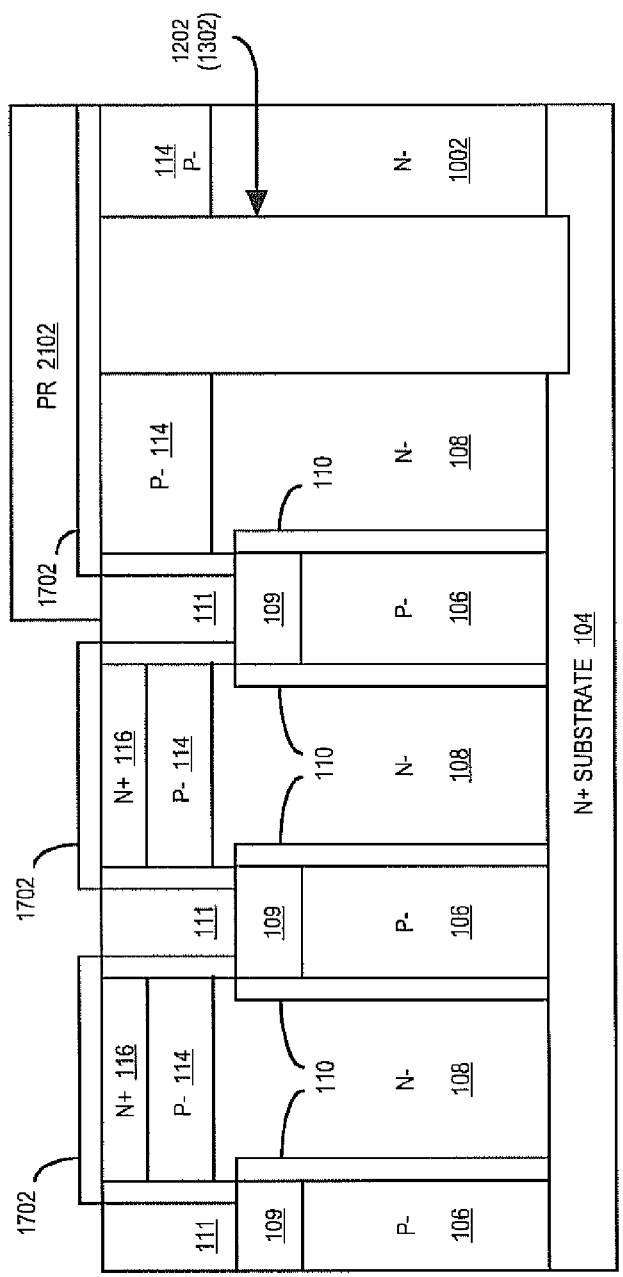

In block 334 of FIG. 3B, a source mask 2102 is formed over the termination trench 1202 and the adjacent regions as shown in FIG. 21, and n+ dopant is then implanted into the p-type body regions 114 to form the n-type (n+) source regions 116 of FIG. 1. In this manner, trench gates are formed over the p-type columns 106 instead of over the n-type columns 108. By forming the trench gates over the p-type columns 106, the gates can be placed closer together, increasing the cell density, which also has the effect of reducing Rdson. After the n-type source implant, the mask 2102 can be removed.

Figure 22:
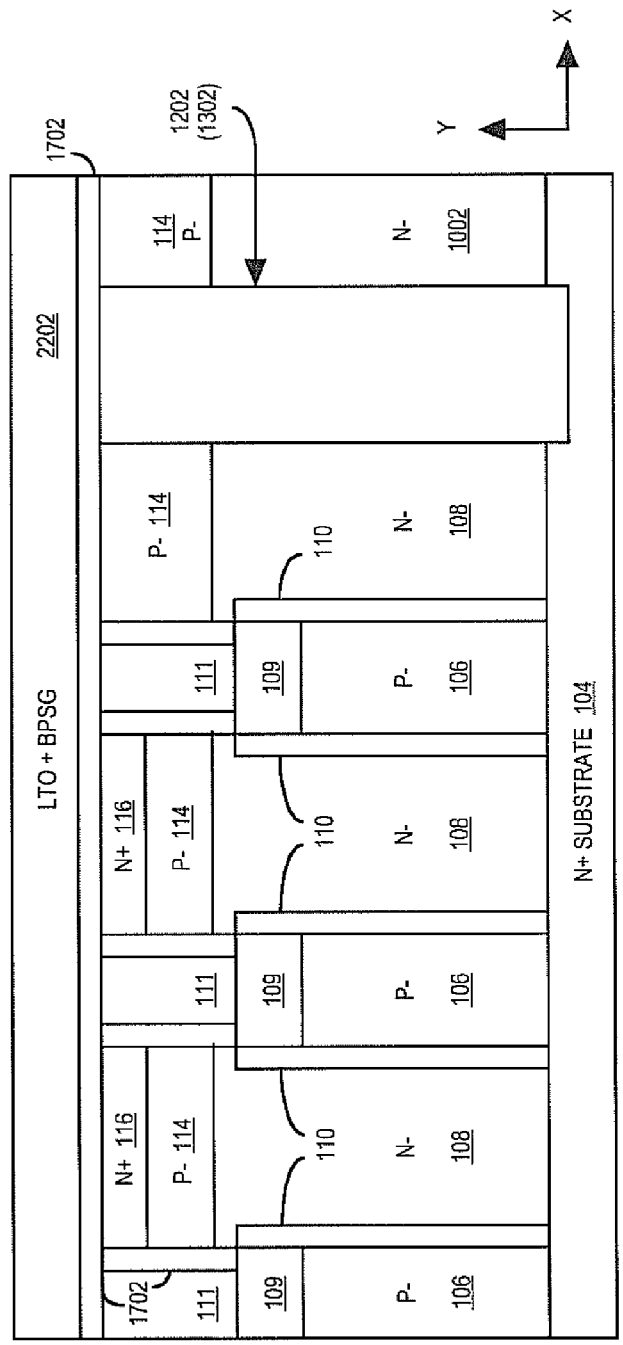

In block 336 of FIG. 3B, a layer of low temperature oxide (LTO) followed by a layer of borophosphosilicate glass (BPSG) are deposited—these layers are identified as layer 2202 in FIG. 22. (For clarity, not all of the gate oxide regions 1702 are identified in FIGS. 22 and 23.)

Figure 23:
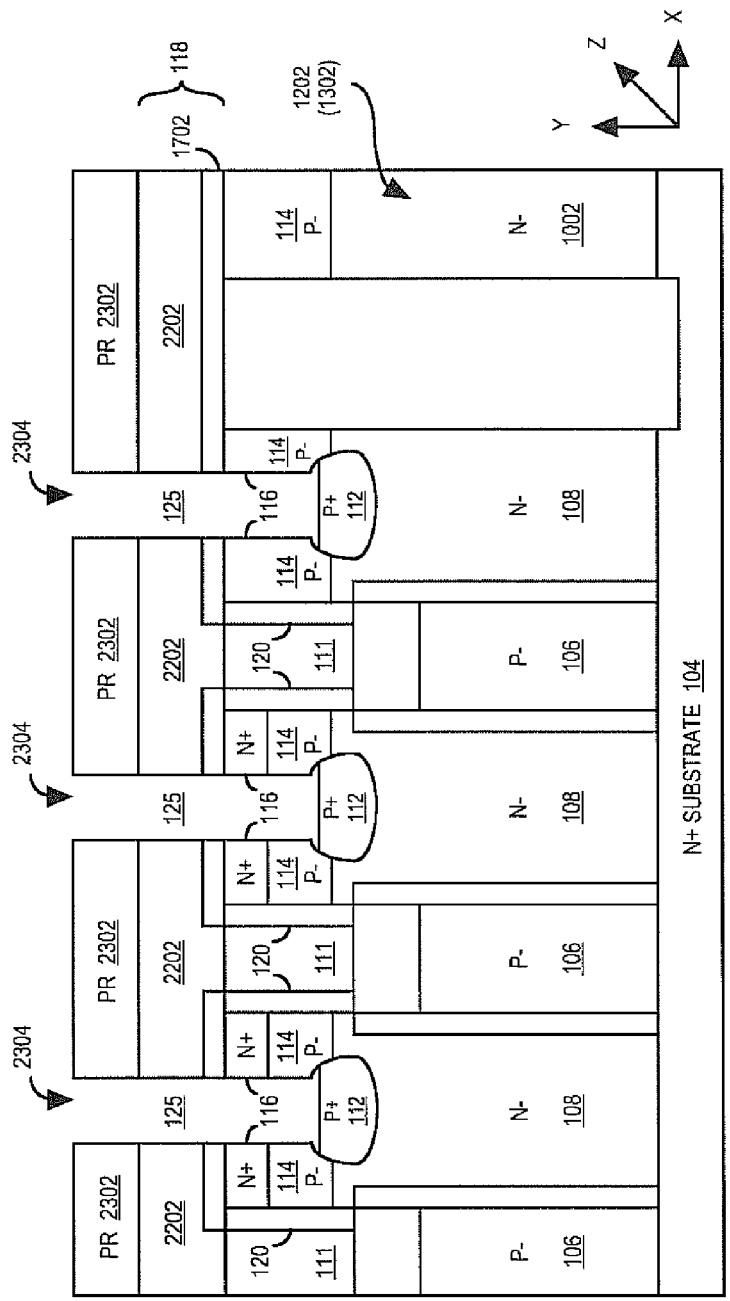

In block 338 of FIG. 3B, a layer of photoresist is applied over the layer 2202 and then selectively removed to form a mask 2302 with openings 2304 that coincide with the n-type columns 108, as shown in FIG. 23. The materials underneath the openings 2304—the portions of the layer 2202, the gate oxide 1702, the n+ source regions 116, and portions of the p-type body regions 114 that are underneath those openings—can then be etched away to form the insulating layers 118 of FIG. 1, and also to form the trenches 125 that expose the n+ source regions 116, p-type body regions 114, and gate pickup regions. The insulating layers 118 of FIG. 1 include both the remaining portions of the layer 2202 and the remaining horizontal (x-direction) portions of the gate oxide layer 1702; the y-direction (vertical) portions of gate oxide layer 1702 coincide with the isolation layers 120 of FIG. 1. At the bottom of each trench 125, p+ dopant is then implanted to form the p-type (p+) contact regions 112 of FIG. 1.

Figure 24:
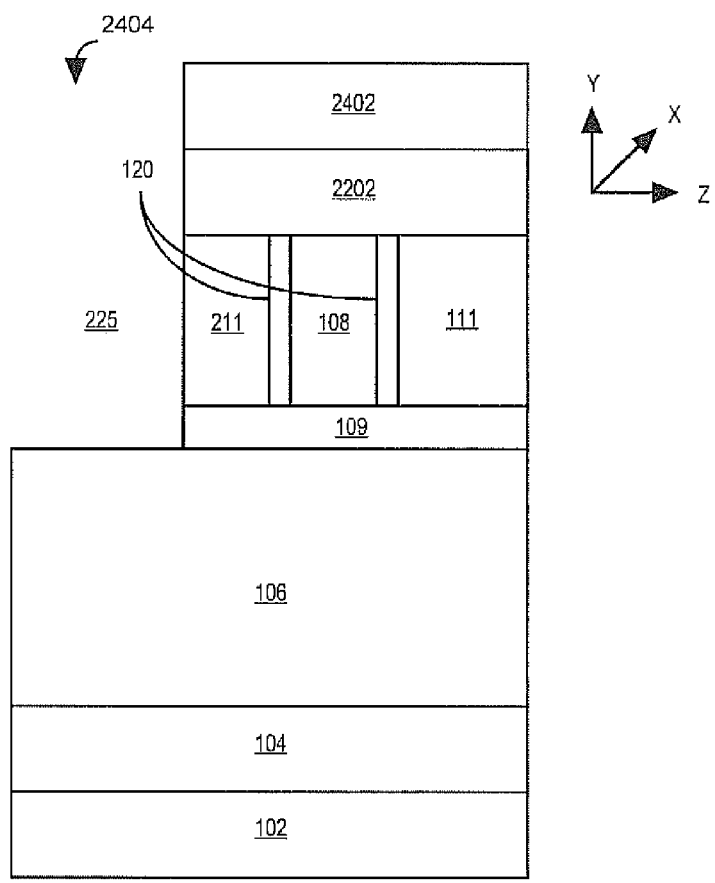

In a similar manner, in block 340 of FIG. 3C, a mask 2402 can be formed in the z-direction of FIG. 23 with openings 2404 that coincide with the p-type columns 106, as shown in FIG. 24. The materials underneath the openings 2404—the portions of the layer 2202, the trench gates 111, and the isolation layers 109 that are underneath those openings—can then be etched away to form the isolated poly region 211 and the trenches 225 that expose the p-type columns 106 and the poly region 211. The p-type column contact trench 225 is isolated from the gate poly 111 by an oxidation layer (gate oxide) 120, an n-type column 108, and another oxidation layer 120, and the trench 225 is also isolated by an oxidation layer 120.

Figure 25:
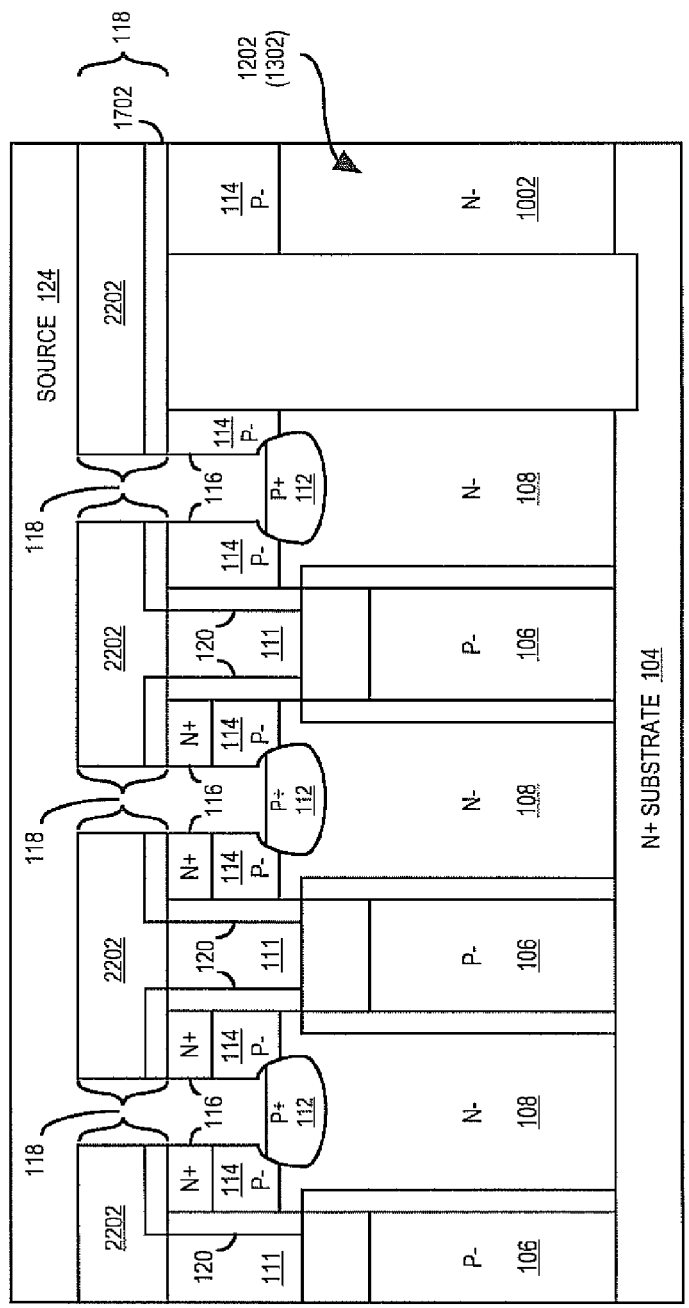
Figure 26:
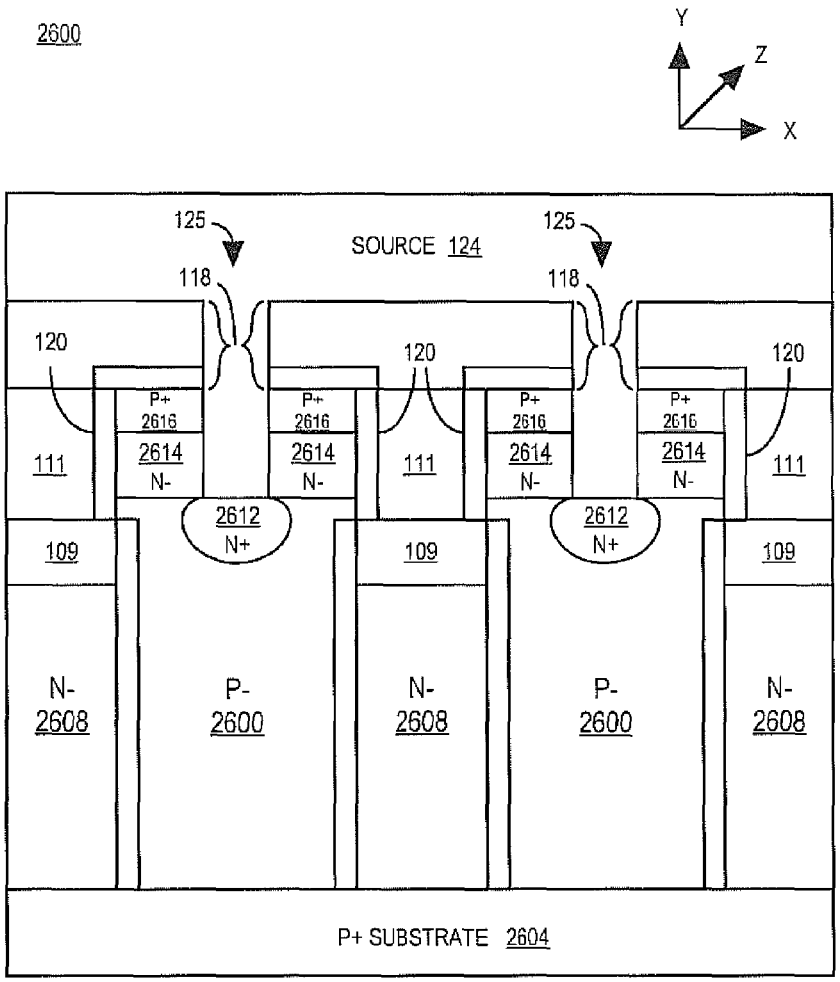
FIG. 26 is a cross-sectional view showing elements of a semiconductor device according to another embodiment of the present invention.

In block 342 of FIG. 3C, with reference also to FIGS. 23, 24, and 25, the mask(s) 2302 and 2402 are removed, and a metal is deposited into the trenches 2304 and 2404 and over the insulating layer 118. A layer of photoresist is applied over the metal and then selectively removed to form a mask (not shown) with openings, and the metal under the openings is etched away to form the source metal layer 124 of FIGS. 1 and 2, and to form a gate bus (not shown). Accordingly, both the p-type columns 106 and the n-type columns 108 are electrically connected to the source metal layer 124 as shown in FIGS. 1 and 2. Consequently, the carriers in the p-type columns 106 can be swept away rapidly when the resultant body diode is switched from on to off.

In block 344 of FIG. 3C, a passivation layer is optionally deposited. A mask can then be applied to etch the passivation layer to define gate and source pads.

As mentioned above, features described herein are applicable also to p-channel SJ trench power MOSFET devices. FIG. 26 is a cross-sectional view showing elements of a p-channel SJ trench power MOSFET device 2600 according to an embodiment of the present invention. The device 2600 includes a drain electrode (not shown) on the bottom surface of a p+ drain layer or substrate 2604. Alternating p– drift regions or p-type columns 2606 and n– drift regions or n-type columns 2608 are located above the substrate 2604 to form a super junction. The columns 2606 of p-type dopant are separated from the adjacent columns 2608 of n-type dopant by isolation layers or columns 110 to keep the n-type and p-type columns from diffusing into one another when the structure is heated during fabrication.

In the FIG. 26 embodiment, each n-type column 2608 is located under a respective polysilicon trench gate 111. The n-type columns 2608 are separated from the trench gates 111 by a respective isolation layer 109. By aligning the trench gates 111 with the n-type columns 2608, the width of the p-type columns 2606 can be reduced so that the trench gates can be placed closer together.

A trench 125 is formed between adjacent trench gates 111, above the p-type columns 2606. The trench 125 is filled with a source metal 124. An n+ region (n-contact region 2612) separates the source metal 124 in each trench 125 from a corresponding p-type column 2606. An n– region (n-body region 2614) is situated on each side of each trench 125, between the trench and a trench gate 111 and also between the source metal 124 and a p-type column 2606. Also, p+ regions (p-source regions 2616) are situated on opposite sides of each trench 125. The n-type body regions 2614 and p-type source regions 2616 are separated from a respective trench gate 111 by another isolation layer 120 (e.g., a gate oxide). An insulating layer 118 can be formed over each p-type source region 2616 and each trench gate 111. The source metal layer 124 is formed over the insulating layer 118 and, as mentioned above, extends into the trenches 125.

According to an embodiment of the invention, the n-type columns 2608 are picked up and electrically shorted to the source metal layer 124, in a manner similar to that shown in FIG. 2.

In summary, embodiments of SJ trench power MOSFET devices, and embodiments of methods for fabricating such devices, are described. The features described herein can be used in low voltage devices as well as high voltage devices such as 1000-volt power MOSFETs as an alternative to split-gate, dual-trench and other conventional high voltage super junction devices.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a super junction trench power metal oxide semiconductor field effect transistor (MOSFET) device having a channel of a first type dopant, said method comprising:

forming a column of second type dopant on a substrate of said first type dopant, wherein said substrate is adjacent to a drain electrode;

depositing a layer of oxide on said substrate and on opposite sides of said column of said second type dopant to form a first column of oxide on said substrate and a second column of oxide on said substrate;

forming a first column of said first type dopant on and in contact with said substrate and adjacent said first column of oxide and forming a second column of said first type dopant on and in contact with said substrate and adjacent said second column of oxide, said column of said second type dopant separated from said first and second columns of said first type dopant by said first and second columns of oxide;

forming a gate element for a field effect transistor between said first column of said first type dopant and said second column of said first type dopant and above said column of said second type dopant;

forming a body region of said second type dopant and forming a source region of said first type dopant adjacent to said gate element;

forming a trench that extends in said first column of said first type dopant, wherein said trench extends through said source region and into said body region;

implanting a region of said second type dopant between said trench and said first column of said first type dopant, said region in contact with both said trench and said first column of said first type dopant and said region separating said trench from said first column of said first type dopant; and depositing source metal to fill said trench, wherein said region of said second type dopant is in contact with said source metal in said trench and separates said source metal in said trench from said first column of said first type dopant, and wherein said body region and said source region are exposed to and in contact with said source metal in said trench.

2. The method of claim 1 further comprising depositing an oxide layer above said column of said second type dopant prior to forming said gate element to separate said column of said second type dopant from said gate element.

3. The method of claim 1 wherein said first type dopant comprises n-type dopant and said second type dopant comprises p-type dopant.

4. The method of claim 1 further comprising forming an electrical connection that electrically shorts said column of said second type dopant to said layer of source metal.

5. The method of claim 4 wherein said column of first type dopant and said column of second type dopant each have a first dimension greater than a second dimension, said first dimension measured in a first direction and said second dimension measured in a second direction that is orthogonal to said first direction, wherein said source metal is electrically shorted to said column of second type dopant in a third direction that is orthogonal to said first direction and said second direction.

6. The method of claim 1 wherein said trench is aligned with the longitudinal axis of said first column of said first type dopant.

7. The method of claim 1 wherein said first type dopant comprises p-type dopant and said second type dopant comprises n-type dopant.

8. The method of claim 1 wherein said trench extends in said first column in the direction of the longitudinal axis of said trench, wherein said region is between said trench and said first column of said first type dopant in said direction of said longitudinal axis.

9. The method of claim 1 wherein said region is wider than said trench.

* * * * *